(12) United States Patent
Yamauchi et al.

(10) Patent No.: US 8,050,423 B2
(45) Date of Patent: Nov. 1, 2011

(54) INTEGRATED CIRCUIT DEVICE AND AUDIO SYSTEM

(75) Inventors: Akira Yamauchi, Yokohama (JP);
Hiroyuki Tsurumi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 791 days.

(21) Appl. No.: 12/165,716

(22) Filed: Jul. 1, 2008

(65) Prior Publication Data
US 2009/0010454 A1 Jan. 8, 2009

(30) Foreign Application Priority Data
Jul. 2, 2007 (JP) ................................. 2007-174413

(51) Int. Cl.
*H04B 15/00* (2006.01)
(52) U.S. Cl. ......... 381/94.5; 381/120; 381/121; 330/10; 330/69
(58) Field of Classification Search .................. 381/94.5, 381/120, 121; 330/10, 69
See application file for complete search history.

(56) References Cited

U.S. PATENT DOCUMENTS
5,796,303 A 8/1998 Vinn et al.

FOREIGN PATENT DOCUMENTS
| JP | 2005-295011 | | 10/2005 |
| JP | 2006-093975 | | 4/2006 |
| JP | 2006093975 A | * | 4/2006 |
| JP | 2006-262264 | | 9/2006 |
| JP | 2006262264 A | * | 9/2006 |
| JP | 2007-214633 | | 8/2007 |

OTHER PUBLICATIONS

Japanese Office Action for Application No. 2007-174413 mailed on Feb. 18, 2011.

* cited by examiner

*Primary Examiner* — Marcos D. Pizarro
(74) *Attorney, Agent, or Firm* — Turocy & Watson, LLP

(57) ABSTRACT

An n-channel integrated circuit device (n is an integer of 1 or greater) for muting an audio signal includes a control circuit configured to generate a control signal and a delayed control signal, a charging and discharging circuit configured to charge and discharge a time constant control terminal according to the control signal and the delayed control signal, an N-th voltage-to-current converting circuit (N is an integer from 1 to n) configured to generate a (2N−1)-th current corresponding to a voltage on the time constant control terminal and a (2N)-th current corresponding to an intermediate voltage, a (2N−1)-th mirror circuit configured to copy the (2N−1)-th current to generate (4N−3)-th and (4N−2)-th intermediate currents, a (2N)-th mirror circuit configured to copy the (2N)-th current to generate (4N−1)-th and (4N)-th intermediate currents, a (2N−1)-th selecting and combining circuit configured to combine a (2N−1)-th mute control current using the (4N−3)-th intermediate current and the (4N−1)-th intermediate current, and a (2N)-th selecting and combining circuit configured to combine a (2N)-th mute control current using the (4N−2)-th intermediate current and the (4N)-th intermediate current.

20 Claims, 17 Drawing Sheets

INTEGRATED CIRCUIT DEVICE AND AUDIO SYSTEM

CROSS REFERENCE TO RELATED APPLICATIONS

This application is based upon and claims the benefit of priority from the prior Japanese Patent Application No. 2007-174413, filed on Jul. 2, 2007, the entire contents of which are incorporated herein by reference.

BACKGROUND OF THE INVENTION

1. Field of the Invention

The present invention relates to an integrated circuit device and an audio system.

2. Background Art

In many cases, an audio system is provided with a muting circuit for muting an audio signal, and capable of switching between a sound output state and a mute state. It is known that a rasping sound referred to as "pop sound" is induced in such an audio system, when switching between the sound output state and the mute state. To reduce this pop sound, such an audio system is often provided with a time constant circuit for slowing the switching between the sound output state and the mute state.

The time constant circuit is generally configured with a resistor R and a capacitor C. A time constant around 10 to 100 msec is considered necessary to reduce the pop sound. However, it is difficult to achieve such a time constant with an IC (integrated circuit). Therefore, in the audio system, though the muting circuit is generally realized with the IC, the time constant circuit is provided out of the IC. In this case, the time constant circuit is connected to a time constant control terminal of the IC.

In recent years, attention has been attracted to multi-CH (channel) independent muting. For example, there exists such a demand that only a specific CH should be muted among six CHs of an audio system. In such a case, time constant circuits and time constant control terminals as many as CHs are required. However, as described above, since a time constant circuit is realized with elements out of an IC, it is highly costly to provide the time constant circuit. Therefore, it is disadvantageous in terms of cost to provide time constant circuits as many as CHs. Therefore, an audio system is proposed in which a single time constant circuit and a single time constant control terminal are associated with plural CHs (JP-A 2005-295011 (KOKAI) for example).

Description will now be made to an example of the audio system in which a single time constant circuit and a single time constant control terminal are associated with plural CHs.

Such an audio system includes, for example, sound output amplifiers and mute amplifiers, and a muting circuit of the audio system outputs mute control currents for controlling the sound output amplifiers and mute control currents for controlling the mute amplifiers, to mute an audio signal. The muting circuit outputs mute control currents for a first sound output amplifier and a first mute amplifier for muting a first CH, and outputs mute control currents for a second sound output amplifier and a second mute amplifier for muting a second CH. The muting circuit is connected to the time constant control terminal and the time constant circuit, both of which are common to these CHs.

An exemplary configuration of the muting circuit will be described. The muting circuit includes plural mute control current generating circuits connected to the time constant control terminal, a charging and discharging circuit configured to charge and discharge the time constant control terminal, and a control circuit configured to control the plural mute control current generating circuits and the charging and discharging circuit. Each of the mute control current generating circuits includes a V-I (voltage to current) converting circuit configured to compare a voltage of the time constant control terminal with a intermediate voltage, and generate a current $I_A$ corresponding to the voltage of the time constant control terminal and a current $I_B$ corresponding to the intermediate voltage, and a mute control current selecting and combining circuit configured to selectively combine the current $I_A$ and the current $I_B$ to generate a current $I_{out}$. In a subsequent stage of each of the mute control current generating circuits, there are provided a resistor for converting the current $I_{out}$ to a voltage $V_{out}$, and a V-I (voltage to current) converting circuit for generating mute control currents $I_{out-A}$ and $I_{out-B}$ by using the voltage $V_{out}$ (the V-I converting circuit is also referred to as a Gm amplifier, and hereinafter, may be expressed as a subsequent V-I converting circuit). The mute control current generating circuits are provided as many as the CHs of the audio system.

Then, an example of operations of the muting circuit will be described. Under the control by the control circuit, the charging and discharging circuit starts charging the time constant control terminal. The time constant control terminal is continued to be charged until the voltage on the time constant control terminal is changed from a first reference voltage to a second reference voltage. Since the time constant control terminal is connected to the time constant circuit, the time constant control terminal is slowly charged. It is assumed that a period for charging the time constant control terminal is $t_1$. The V-I converting circuit needs to switch between a value of $I_A$ and a value of $I_B$ during $t_1$, and is designed so as to carry out such a switching. Therefore, assuming that this switching period is $t_2$, a relation between $t_1$ and $t_2$ becomes $t_1 > t_2$. The subsequent V-I converting circuit needs to switch between a value of $I_{out-A}$ and a value of $I_{out-B}$ during $t_2$, and is designed so as to carry out such a switching. Therefore, assuming that this switching period is $t_3$, a relation between $t_2$ and $t_3$ becomes $t_2 > t_3$.

The period $t_3$ corresponds to a time required for switching between the sound output state and the mute state. Therefore, a shorter period $t_3$ causes rapid switching between the sound output state and the mute state, so that an effect on the pop sound reduction is reduced. Accordingly, it is desirable that the period $t_3$ is as long as possible. However, since there exists such a restriction that a relation between $t_1$, $t_2$, and $t_3$ is $t_1 > t_2 > t_3$, it is difficult to extend the period $t_3$. Due to this restriction, it is necessary to extend the charging period $t_1$ in order to extend the period $t_3$. In order to extend the charging period $t_1$, it is necessary to make larger a time constant of the time constant circuit by means of a large capacity of condenser or the like. However, this results in the increased cost of the time constant circuit. As described here, it is difficult to sufficiently reduce the pop sound in the above muting circuit.

Further, the above audio system requires the mute control current $I_{out-A}$ for the sound output amplifier, and the mute control current $I_{out-B}$ for the mute amplifier. Therefore, the muting circuit requires the subsequent V-I converting circuit for generating the mute control currents $I_{out-A}$ and $I_{out-B}$ from the current $I_{out}$ (the voltage $V_{out}$). Therefore, the muting circuit would suffer from a problem of an increased IC chip area due to including the subsequent V-I converting circuit.

SUMMARY OF THE INVENTION

An aspect of the present invention is, for example, an n-channel integrated circuit device (n is an integer of 1 or greater) for muting an audio signal, the device including a control circuit configured to generate a control signal for controlling to switch between a sound output state and a mute state, and a delayed control signal obtained by delaying the control signal, a charging and discharging circuit configured to charge or discharge a time constant control terminal according to the control signal, to change a voltage on the time constant control terminal from a first reference voltage to a second reference voltage, and to discharge or charge the time constant control terminal according to the delayed control signal, to change the voltage on the time constant control terminal from the second reference voltage to the first reference voltage, an N-th voltage-to-current converting circuit (N is an integer from 1 to n) configured to compare the voltage on the time constant control terminal with an intermediate voltage which is between the first reference voltage and the second reference voltage, and generate a (2N−1)-th current corresponding to the voltage on the time constant control terminal and a (2N)-th current corresponding to the intermediate voltage, the N-th voltage-to-current converting circuit being configured to switch between a value of the (2N−1)-th current and a value of the (2N)-th current within a period for charging or discharging the time constant control terminal, a (2N−1)-th mirror circuit configured to copy the (2N−1)-th current to generate (4N−3)-th and (4N−2)-th intermediate currents, a (2N)-th mirror circuit configured to copy the (2N)-th current to generate (4N−1)-th and (4N)-th intermediate currents, a (2N−1)-th selecting and combining circuit configured to cut off or select the (4N−3)-th intermediate current and cut off or select the (4N−1)-th intermediate current, according to the control signal and the delayed control signal, to combine a (2N−1)-th mute control current, and a (2N)-th selecting and combining circuit configured to cut off or select the (4N−2)-th intermediate current and cut off or select the (4N)-th intermediate current, according to the control signal and the delayed control signal, to combine a (2N)-th mute control current.

Another aspect of the present invention is, for example, an integrated circuit device for muting an audio signal, the device including a control circuit configured to generate a control signal for controlling to switch between a sound output state and a mute state, and a delayed control signal obtained by delaying the control signal, a charging and discharging circuit configured to charge or discharge a time constant control terminal according to the control signal, to change a voltage on the time constant control terminal from a first reference voltage to a second reference voltage, and to discharge or charge the time constant control terminal according to the delayed control signal, to change the voltage on the time constant control terminal from the second reference voltage to the first reference voltage, an voltage-to-current converting circuit configured to compare the voltage on the time constant control terminal with an intermediate voltage which is between the first reference voltage and the second reference voltage, and generate a first current corresponding to the voltage on the time constant control terminal and a second current corresponding to the intermediate voltage, the voltage-to-current converting circuit being configured to switch between a value of the first current and a value of the second current within a period for charging or discharging the time constant control terminal, a first mirror circuit configured to copy the first current to generate first and second intermediate currents, a second mirror circuit configured to copy the second current to generate third and fourth intermediate currents, a first selecting and combining circuit configured to cut off or select the first intermediate current and cut off or select the third intermediate current, according to the control signal and the delayed control signal, to combine a first mute control current, and a second selecting and combining circuit configured to cut off or select the second intermediate current and cut off or select the fourth intermediate current, according to the control signal and the delayed control signal, to combine a second mute control current.

Another aspect of the present invention is, for example, an audio system including an n-channel integrated circuit device (n is an integer of 1 or greater) for muting an audio signal, the device including a control circuit configured to generate a control signal for controlling to switch between a sound output state and a mute state, and a delayed control signal obtained by delaying the control signal, a charging and discharging circuit configured to charge or discharge a time constant control terminal according to the control signal, to change a voltage on the time constant control terminal from a first reference voltage to a second reference voltage, and to discharge or charge the time constant control terminal according to the delayed control signal, to change the voltage on the time constant control terminal from the second reference voltage to the first reference voltage, an N-th voltage-to-current converting circuit (N is an integer from 1 to n) configured to compare the voltage on the time constant control terminal with an intermediate voltage which is between the first reference voltage and the second reference voltage, and generate a (2N−1)-th current corresponding to the voltage on the time constant control terminal and a (2N)-th current corresponding to the intermediate voltage, the N-th voltage-to-current converting circuit being configured to switch between a value of the (2N−1)-th current and a value of the (2N)-th current within a period for charging or discharging the time constant control terminal, a (2N−1)-th mirror circuit configured to copy the (2N−1)-th current to generate (4N−3)-th and (4N−2)-th intermediate currents, a (2N)-th mirror circuit configured to copy the (2N)-th current to generate (4N−1)-th and (4N)-th intermediate currents, a (2N−1)-th selecting and combining circuit configured to cut off or select the (4N−3)-th intermediate current and cut off or select the (4N−1)-th intermediate current, according to the control signal and the delayed control signal, to combine a (2N−1)-th mute control current, and a (2N)-th selecting and combining circuit configured to cut off or select the (4N−2)-th intermediate current and cut off or select the (4N)-th intermediate current, according to the control signal and the delayed control signal, to combine a (2N)-th mute control current, an N-th sound output amplifier configured to be controlled by the (2N−1)-th mute control current, an N-th mute amplifier configured to be controlled by the (2N)-th mute control current, and an N-th speaker connected to the N-th sound output amplifier and the N-th mute amplifier.

DESCRIPTION OF THE EMBODIMENTS

Embodiments of the present invention will be described below with reference to the accompanying drawings.

Figure 1:
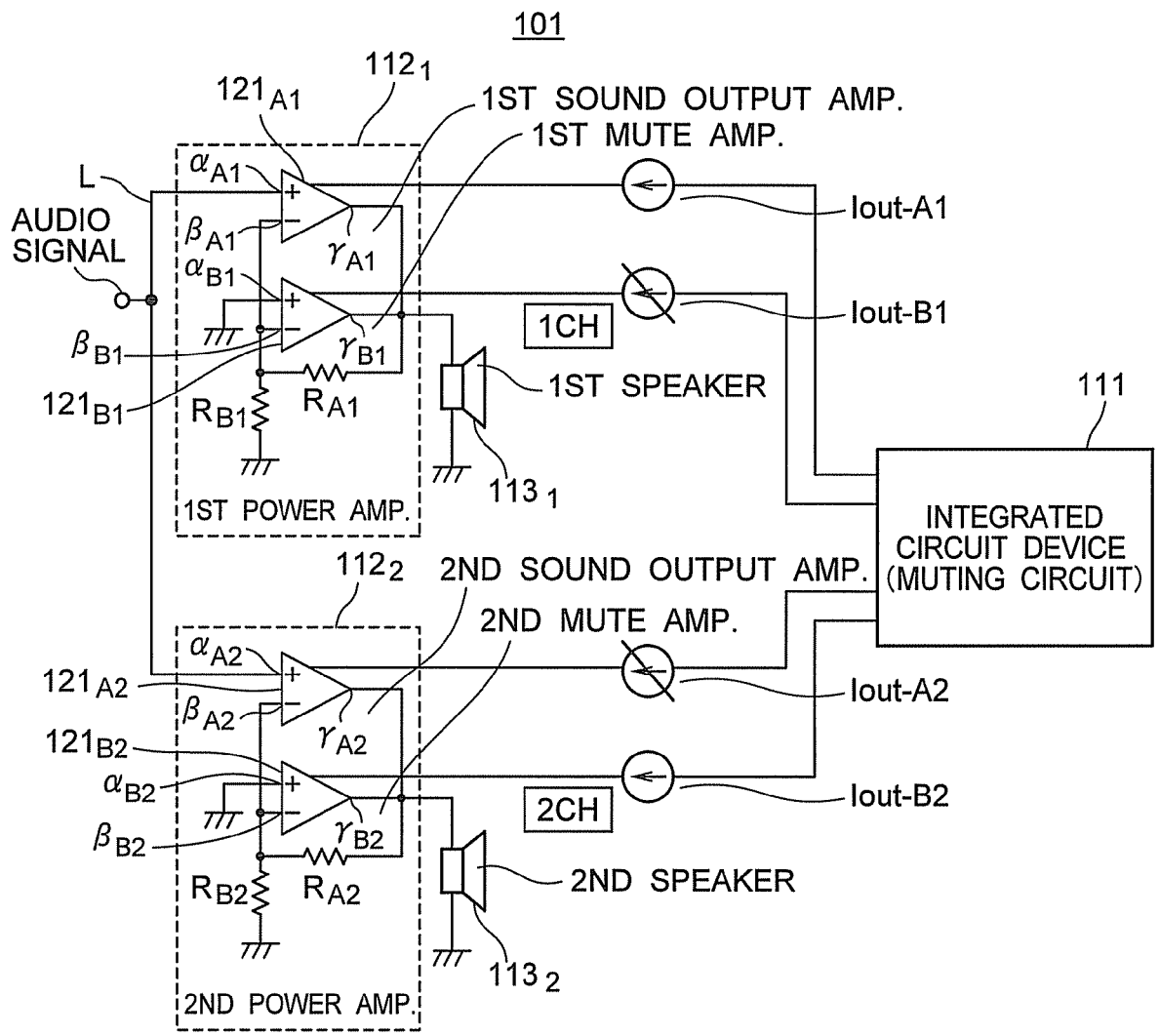
FIG. 1 shows a system configuration of an audio system according to an embodiment.

FIG. 1 shows a system diagram of an audio system 101 according to an embodiment. The audio system 101 of FIG. 1 includes an integrated circuit device 111 according to the present embodiment, a first power amplifier $112_1$, a second power amplifier $112_2$, a first speaker $113_1$, and a second speaker $113_2$. The first power amplifier $112_1$ includes a first sound output amplifier $121_{A1}$, and a first mute amplifier $121_{B1}$. The second power amplifier $112_2$ includes a second sound output amplifier $121_{A2}$, and a second mute amplifier $121_{B2}$.

The integrated circuit device 111 includes a muting circuit for muting an audio signal. The integrated circuit device 111 outputs mute control currents $I_{out-A1}$ and $I_{out-B1}$ as mute control currents for a first CH. The mute control currents $I_{out-A1}$ and $I_{out-B1}$ are supplied for controlling the first sound output amplifier $121_{A1}$ and the first mute amplifier $121_{B1}$ respectively. The integrated circuit device 111 outputs mute control currents $I_{out-A2}$ and $I_{out-B2}$ as mute control signals for a second CH. The mute control currents $I_{out-A2}$ and $I_{out-B2}$ are supplied for controlling the second sound output amplifier $121_{A2}$ and the second mute amplifier $121_{B2}$ respectively.

The first power amplifier $112_1$ and the first speaker $113_1$ are provided as a power amplifier and a speaker for the first CH. The first sound output amplifier $121_{A1}$ is provided for causing the first CH to be in the sound output state, and is controlled by the mute control current $I_{out-A1}$. As shown in FIG. 1, the audio signal is inputted to an input of the first sound output amplifier $121_{A1}$. The first mute amplifier $121_{B1}$ is provided for causing the first CH to be in the mute state, and is controlled by the mute control current $I_{out-B1}$. An input of the first mute amplifier $121_{B1}$ is grounded as shown in FIG. 1. The first speaker $113_1$ is connected to the first sound output amplifier $121_{A1}$ and the first mute amplifier $121_{B1}$. The audio system 101 of FIG. 1 may be provided with one speaker, or two or more speakers, as a speaker for the first CH, that is, the first speaker $113_1$.

The circuit configuration regarding the first power amplifier $112_1$ and the first speaker $113_1$ will be described.

The first sound output amplifier $121_{A1}$ includes an input terminal $\alpha_{A1}$, an input terminal $\beta_{A1}$, and an output terminal $\gamma_{A1}$. In this embodiment, while the $\alpha_{A1}$ is a plus terminal and the $\beta_{A1}$ is a minus terminal, the $\alpha_{A1}$ may be a minus terminal and the $\beta_{B1}$ may be a plus terminal. The first mute amplifier $121_{B1}$ includes an input terminal $\alpha_{B1}$, an input terminal $\beta_{B1}$, and an output terminal $\gamma_{B1}$. In this embodiment, while the $\alpha_{B1}$ is a plus terminal and the $\beta_{B1}$ is a minus terminal, the $\alpha_{B1}$ may be a minus terminal and the $\beta_{B1}$ may be a plus terminal.

In this embodiment, the input terminal $\alpha_{A1}$ of the first sound output amplifier $121_{A1}$ is connected to an audio signal line L. The input terminal $\alpha_{B1}$ of the first mute amplifier $121_{B1}$ is connected to the ground. The output terminal $\gamma_{A1}$ of the first sound output amplifier $121_{A1}$ and the output terminal $\gamma_{B1}$ of the first mute amplifier $121_{B1}$ are connected to the first speaker $113_1$. The input terminal $\beta_{A1}$ of the first sound output amplifier $121_{A1}$ and the input terminal $\beta_{B1}$ of the first mute amplifier $121_{B1}$ are connected to the output terminal $\gamma_{A1}$ of the first sound output amplifier $121_{A1}$ and the output terminal $\gamma_{B1}$ of the first mute amplifier $121_{B1}$ through an $R_{A1}$ (a first resistor), and are connected to the ground through an $R_{B1}$ (a second register). The first sound output amplifier $121_{A1}$, the first mute amplifier $121_{B1}$, and the $R_{A1}$ are mutually connected in parallel. The first resistor is an example of a first feedback circuit. The first feedback circuit in this embodiment is a resistor feedback, but may be a full feedback. The first feedback circuit may be configured with a component other than the register.

The second power amplifier $112_2$ and the second speaker $113_2$ are provided as a power amplifier and a speaker for the second CH. The second sound output amplifier $121_{A2}$ is provided for causing the second CH to be in the sound output state, and is controlled by the mute control current $I_{out-A2}$. As shown in FIG. 1, the audio signal is inputted to an input of the second sound output amplifier $121_{A2}$. The second mute amplifier $121_{B2}$ is provided for causing the second CH to be in the mute state, and is controlled by the mute control current $I_{out-B2}$. An input of the second mute amplifier $121_{B2}$ is grounded as shown in FIG. 1. The second speaker $113_2$ is connected to the second sound output amplifier $121_{A2}$ and the second mute amplifier $121_{B2}$. The audio system 101 of FIG. 1 may be provided with one speaker, or two or more speakers, as a speaker for the second CH, that is, the second speaker $113_2$.

The circuit configuration regarding the second power amplifier $112_2$ and the second speaker $113_2$ will be described.

The second sound output amplifier $121_{A2}$ includes an input terminal $\alpha_{A2}$, an input terminal $\beta_{A2}$, and an output terminal $\gamma_{A2}$. In this embodiment, while the $\alpha_{A2}$ is the plus terminal and the $\beta_{A2}$ is the minus terminal, the $\alpha_{A2}$ may be a minus terminal and the $\beta_{A2}$ may be a plus terminal. The second mute amplifier $121_{B2}$ includes an input terminal $\alpha_{B2}$, an input terminal $\beta_{B2}$, and an output terminal $\gamma_{B2}$. In this embodiment, while the $\alpha_{B2}$ is the plus terminal and the $\beta_{B2}$ is the minus terminal, the $\alpha_{B2}$ may be a minus terminal and the $\beta_{B2}$ may be a plus terminal.

In this embodiment, the input terminal $\alpha_{A2}$ of the second sound output amplifier $121_{A2}$ is connected to the audio signal line L. The input terminal $\alpha_{B2}$ of the second mute amplifier $121_{B2}$ is connected to the ground. The output terminal $\gamma_{A2}$ of the second sound output amplifier $121_{A2}$ and the output terminal $\gamma_{B2}$ of the second mute amplifier $121_{B2}$ are connected to the second speaker $113_2$. The input terminal $\beta_{A2}$ of the second sound output amplifier $121_{A2}$ and the input terminal $\beta_{B2}$ of the second mute amplifier $121_{B2}$ are connected to the output terminal $\gamma_{A2}$ of the second sound output amplifier $121_{A2}$ and the output terminal $\gamma_{B2}$ of the second mute amplifier $121_{B2}$ through an $R_{A2}$ (a third resistor), and are connected to the ground through an $R_{B2}$ (a fourth register). The second sound output amplifier $121_{A2}$, the second mute amplifier $121_{B2}$, and $R_{A2}$ are mutually connected in parallel. The third resistor is an example of a second feedback circuit. The second feedback circuit in this embodiment is a resistor feedback, but may be a full feedback. The second feedback circuit may be configured with a component other than the register.

Figure 2:
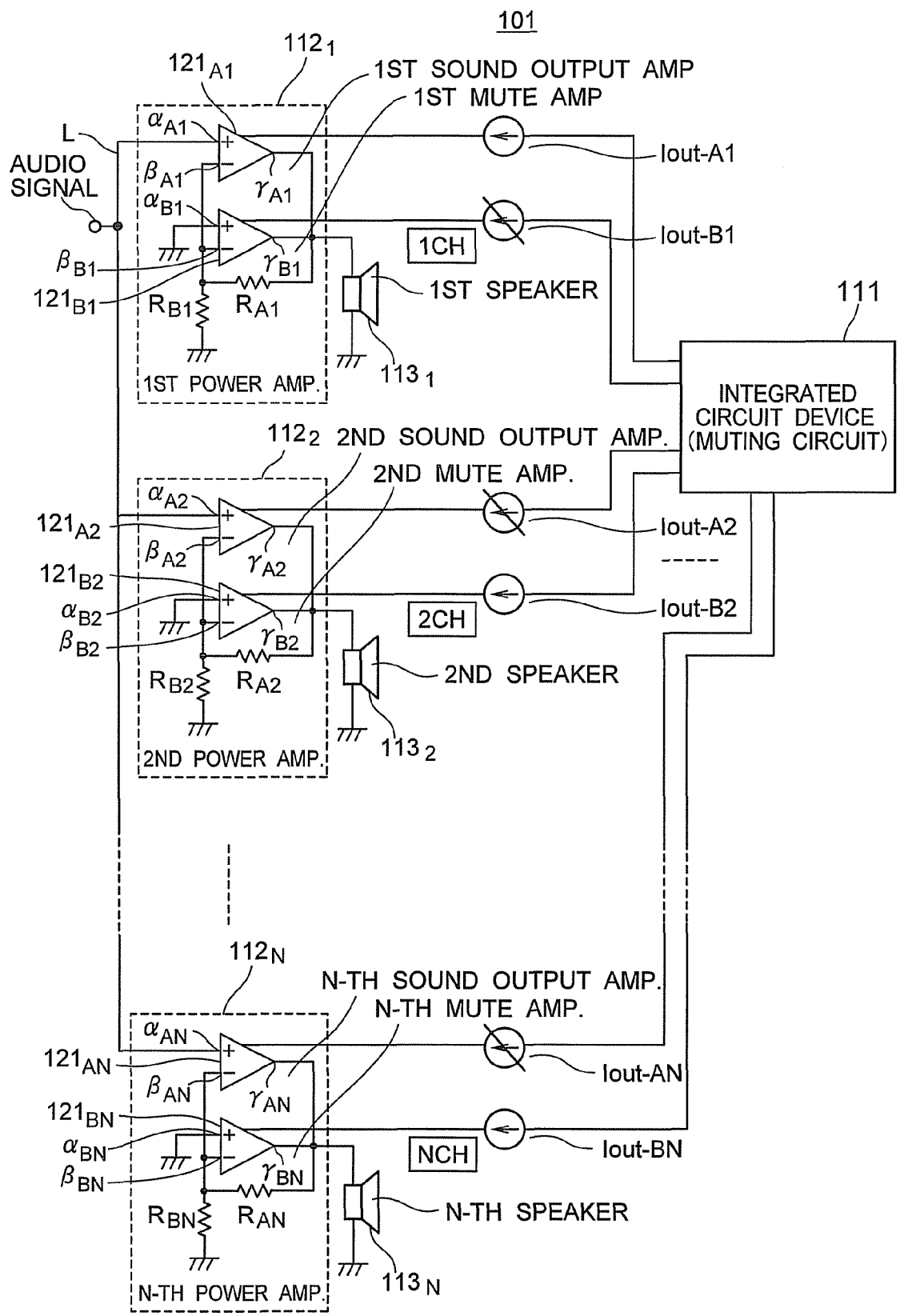
FIG. 2 shows a system configuration of an audio system according to a modified embodiment.

The audio system 101 in this embodiment may have two channels (CHs) as illustrated in FIG. 1, or may have three or more channels as illustrated in FIG. 2. It is assumed here that a structure and operations of each channel of FIG. 2 are the same as those of each channel of FIG. 1. Hereinafter, the integrated circuit device 111 included in the audio system 101 of FIG. 1 will be described. However, the following description can also be applied to the integrated circuit device 111 included in the audio system 101 of FIG. 2. It is assumed that "N" in FIG. 2 is an integer of 3 or greater. A power amplifier $112_N$ is an N-th power amplifier, a speaker $113_N$ is an N-th speaker, a sound output amplifier $121_{AN}$ is an N-th sound output amplifier, and a mute amplifier $121_{BN}$ is an N-th mute amplifier. Further, an $R_{AN}$ is a (2N−1)-th resistor, an $R_{BN}$ is a (2N)-th resistor. The (2N−1)-th resistor is an example of an N-th feedback circuit.

Figure 3:
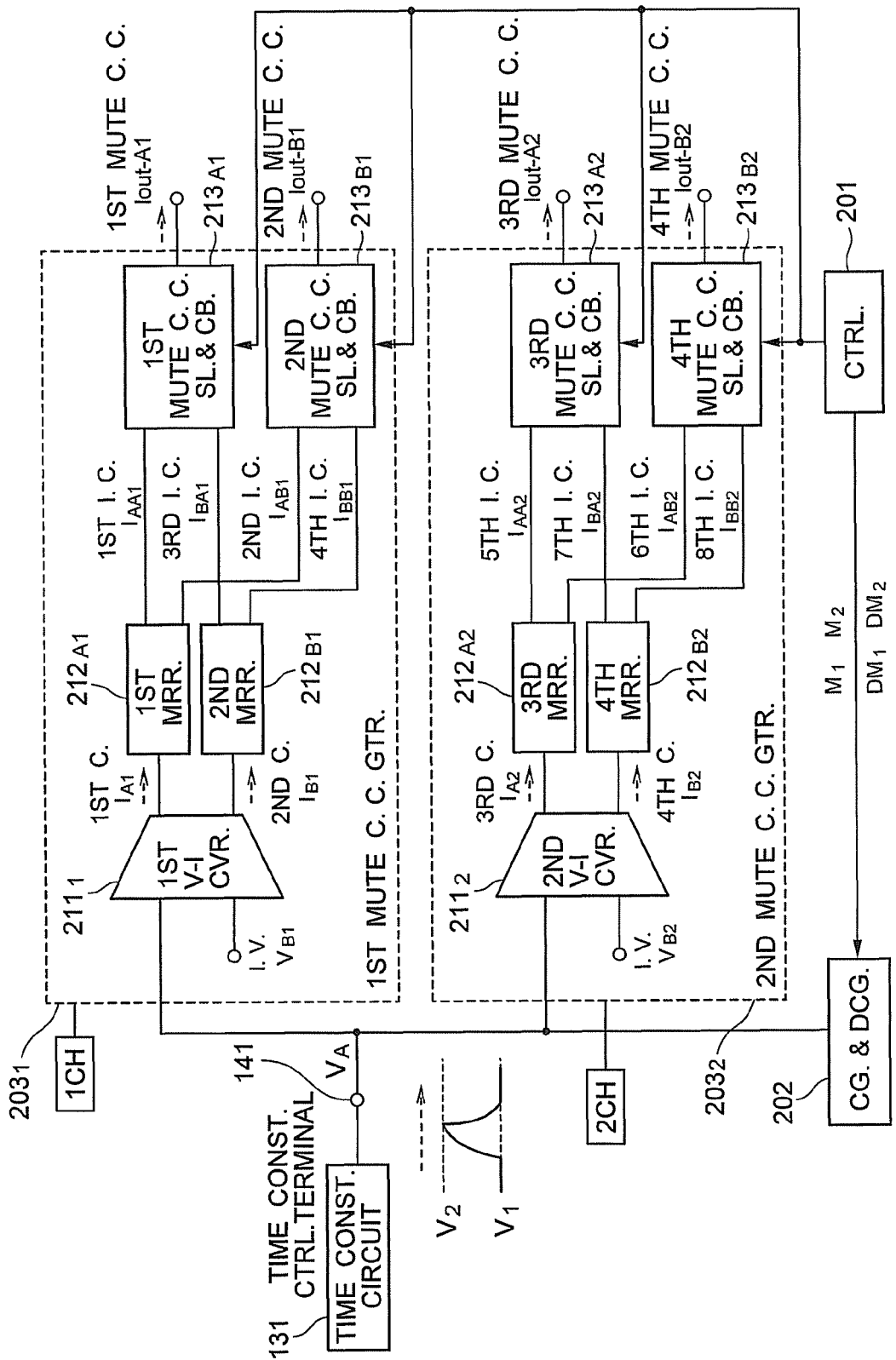
FIG. 3 is a block diagram of an integrated circuit device according to the embodiment.

FIG. 3 is a block diagram of the integrated circuit device 111 according to this embodiment. The integrated circuit device 111 of FIG. 3 corresponds to the integrated circuit device 111 of FIG. 1. The integrated circuit device 111 of FIG. 3 includes a control circuit 201, a charging and discharging circuit 202, a first mute control current generating circuit $203_1$, and a second mute control current generating circuit $203_2$. Hereinafter, the first and second mute control current generating circuits $203_1$ and $203_2$ are referred to as first and second control current generating circuits $203_1$ and $203_2$ respectively. The integrated circuit device 111 of FIG. 3 further includes a time constant control terminal 141 connected to a time constant circuit 131. The time constant circuit 131 and the time constant control terminal 141 are common to the first and second CHs.

The control circuit 201 is configured to control the charging and discharging circuit 202, the first control current generating circuit $203_1$, and the second control current generating circuit $203_2$. The control circuit 201 generates a first mute signal (control signal) $M_1$ and a first delayed mute signal (delayed control signal) $DM_1$ as signals for the first CH, and generates a second mute signal (control signal) $M_2$ and a second delayed mute signal (delayed control signal) $DM_2$ as signals for the second CH. The first and second mute signals $M_1$ and $M_2$ are supplied for controlling the switching between the sound output state and the mute state for the first and second CHs respectively. The first and second delayed mute signals $DM_1$ and $DM_2$ are delayed signals of the first and second mute signals $M_1$ and $M_2$.

The charging and discharging circuit 202 is configured to charge and discharge the time constant control terminal 141. The charging and discharging circuit 202 charges the time constant control terminal 141 according to the first or second mute signal $M_1$ or $M_2$, to change a voltage on the time constant control terminal 141 from a first reference voltage $V_1$ to a second reference voltage $V_2$. The charging and discharging circuit 202 further discharges the time constant control terminal 141 according to the first or second delayed mute signals $DM_1$ and $DM_2$, to change the voltage on the time constant control terminal 141 from the second reference voltage $V_2$ to the first reference voltage $V_1$. In this embodiment, it is assumed that $V_1<V_2$, the time constant control terminal 141 is charged in response to $M_1$ or $M_2$, and the time constant control terminal 141 is discharged in response to $DM_1$ or $DM_2$. However, it may alternatively be assumed that $V_1>V_2$, the time constant control terminal 141 may be discharged in response to $M_1$ or $M_2$, and the time constant control terminal 141 may be charged in response to $DM_1$ or $DM_2$.

The first and second control current generating circuits $203_1$ and $203_2$ are connected to the time constant control terminal 141. The first control current generating circuit $203_1$ includes a first V-I (voltage to current) converting circuit $211_1$, first and second current mirror circuits $212_{A1}$ and $212_{B1}$, and first and second mute control current selecting and combining circuits $213_{A1}$ and $213_{B1}$. The second control current generating circuit $203_2$ includes a second V-I (voltage to current) converting circuit $211_2$, third and fourth current mirror circuits $212_{A2}$ and $212_{B2}$, and third and fourth mute control current selecting and combining circuits $213_{A2}$ and $213_{B2}$. Hereinafter, the first to fourth current mirror circuits are referred to as first to fourth mirror circuits respectively, and the first to fourth mute control current selecting and combining circuits are referred to as first to fourth selecting and combining circuits respectively. It is assumed here that a configuration and operations of the second control current generating circuit $203_2$ are the same as those of the first control current generating circuit $203_1$. Hereinafter, while each block of the first control current generating circuit $203_1$ will be described, the following description can also be applied to each block of the second control current generating circuit $203_2$.

The first V-I converting circuit $211_1$ is configured to compare a voltage $V_A$ of the time constant control terminal 141 with an intermediate voltage $V_{B1}$ which is between the first reference voltage $V_1$ and the second reference voltage $V_2$, and generate a first current $I_{A1}$ corresponding to the voltage $V_A$ on the time constant control terminal 141 and a second current $I_{B1}$ corresponding to the intermediate voltage $V_{B1}$. Further, the first V-I converting circuit $211_1$ is designed so as to switch between a value of the first current $I_{A1}$ and a value of the second current $I_{B1}$ within a period for charging the time constant control terminal 141. Further, the first V-I converting circuit $211_1$ is designed so as to, after starting discharging the time constant control terminal 141, return back the value of the first current $I_{A1}$ and the value of the second current $I_{B1}$ to values before starting charging the time constant control terminal 141. When it is assumed that a relation between $V_1$ and $V_2$ is not $V_1<V_2$ but $V_1>V_2$, the above "within a period for charging", "after starting discharging", and "before starting charging" are replaced by "within a period for discharging", "after starting charging", and "before starting discharging" respectively. When the description of the present paragraph is applied to the second V-I converting circuit $211_2$, the intermediate voltage $V_{B1}$ will be renamed to an intermediate voltage $V_{B2}$, and the first and second currents $I_{A1}$ and $I_{B1}$ will be renamed to a third and fourth currents $I_{A2}$ and $I_{B2}$ respectively. The intermediate voltage $V_{B2}$ may be the same value as the intermediate voltage $V_{B1}$, or may be a different value from the intermediate voltage $V_{B1}$.

The first mirror circuit $212_{A1}$ is configured to copy the first current $I_{A1}$, to generate first and second intermediate currents $I_{AA1}$ and $I_{AB1}$. Since $I_{AA1}$ and $I_{AB1}$ are currents generated by copying $I_{A1}$, there is a relation of $I_{A1}=I_{AA1}=I_{AB1}$. The second mirror circuit $212_{B1}$ is configured to copy the second current $I_{B1}$, to generate third and fourth intermediate currents $I_{BA1}$ and $I_{BB1}$. Since $I_{BA1}$ and $I_{BB1}$ are currents generated by copying the $I_{B1}$, there is a relation of $I_{B1}=I_{BA1}=I_{BB1}$. When the description of the present paragraph is applied to the third and fourth mirror circuits $212_{A2}$ and $212_{B2}$, the first and second currents $I_{A1}$ and $I_{B1}$ will be renamed to the third and fourth currents $I_{A2}$ and $I_{B2}$ respectively, and the first to fourth intermediate currents $I_{AA1}$ to $I_{BB1}$ will be renamed to fifth to eighth intermediate currents $I_{AA2}$ to $I_{BB2}$ respectively.

The first selecting and combining circuit $213_{A1}$ is configured to selectively combine the first intermediate current $I_{AA1}$ and the third intermediate current $I_{BA1}$, to generate a first mute control current $I_{out-A1}$. As exemplified below, the first selecting and combining circuit $213_{A1}$ cuts off or selects the first intermediate current $I_{AA1}$ and cuts off or selects the third intermediate current $I_{BA1}$, according to the first mute signal $M_1$ and the first delayed mute signal $DM_1$, to combine the first mute control current $I_{out-A1}$. The second selecting and combining circuits $213_{B1}$ is configured to selectively combine the second intermediate current $I_{AB1}$ and the fourth intermediate current $I_{BB1}$, to generate a second mute control current $I_{out-B1}$. As exemplified below, the second selecting and combining circuits $213_{B1}$ cuts off or selects the second intermediate current $I_{AB1}$ and cuts off or selects the fourth intermediate current $I_{BB1}$, according to the first mute signal $M_1$ and the first delayed mute signal $DM_1$, to combine the second mute control current $I_{out-B1}$.

The first selecting and combining circuit $213_{A1}$ operates as follows.

When the first mute signal $M_1$ and the first delayed mute signal $DM_1$ are low levels, the first selecting and combining circuit $213_{A1}$ cuts off the first and third intermediate currents $I_{AA1}$ and $I_{BA1}$.

When the first mute signal $M_1$ and the first delayed mute signal $DM_1$ are a high level and a low level respectively, the first selecting and combining circuit $213_{A1}$ selects and cuts off the first and third intermediate currents $I_{AA1}$ and $I_{BA1}$ respectively.

When the first mute signal $M_1$ and the first delayed mute signal $DM_1$ are high levels, the first selecting and combining circuit $213_{A1}$ selects the first and third intermediate currents $I_{AA1}$ and $I_{BA1}$.

When the first mute signal $M_1$ and the first delayed mute signal $DM_1$ are a low level and a high level respectively, the first selecting and combining circuit $213_{A1}$ cuts off and selects the first and third intermediate currents $I_{AA1}$ and $I_{BA1}$ respectively.

Subsequently, the first selecting and combining circuit $213_{A1}$ combines the first mute control current $I_{out-A1}$ using the selected intermediate current. When $I_{AA1}$ or $I_{BA1}$ is selected, $I_{AA1}$ or $I_{BA1}$ itself becomes $I_{out-A1}$. When $I_{AA1}$ and $I_{BA1}$ are selected, a current obtained by adding $I_{AA1}$ and $I_{BA1}$ becomes $I_{out-A1}$. When $I_{AA1}$ and $I_{BA1}$ are cut off, $I_{out-A1}$ becomes "0". As described above, the first mute control current $I_{out-A1}$ is generated from the first and second currents $I_{A1}$ and $I_{B1}$ through the first and third intermediate currents $I_{AA1}$ and $I_{BA1}$.

The second selecting and combining circuits $213_{B1}$ operates as follows.

When the first mute signal $M_1$ and the first delayed mute signal $DM_1$ are low levels, the second selecting and combining circuit $213_{B1}$ selects the second and fourth intermediate currents $I_{AB1}$ and $I_{BB1}$.

When the first mute signal $M_1$ and the first delayed mute signal $DM_1$ are a high level and a low level respectively, the second selecting and combining circuit $213_{B1}$ cuts off and selects the second and fourth intermediate currents $I_{AB1}$ and $I_{BB1}$ respectively.

When the first mute signal $M_1$ and the first delayed mute signal $DM_1$ are high levels, the second selecting and combining circuit $213_{B1}$ cuts off the second and fourth intermediate currents $I_{AB1}$ and $I_{BB1}$.

When the first mute signal $M_1$ and the first delayed mute signal $DM_1$ are a low level and a high level respectively, the second selecting and combining circuit $213_{B1}$ selects and cuts off the second and fourth intermediate currents $I_{AB1}$ and $I_{BB1}$ respectively.

Subsequently, the second selecting and combining circuit $213_{B1}$ combines the second mute control current $I_{out-B1}$ using the selected intermediate current. When $I_{AB1}$ or $I_{BB1}$ is selected, $I_{AB1}$ or $I_{BB1}$ itself becomes $I_{out-B1}$. When $I_{AB1}$ and $I_{BB1}$ are selected, a current obtained by adding $I_{AB1}$ and $I_{BB1}$ becomes $I_{out-B1}$. When $I_{AB1}$ and $I_{BB1}$ are cut off, $I_{out-B1}$ becomes "0". As described above, the second mute control current $I_{out-B1}$ is generated from the first and second currents $I_{A1}$ and $I_{B1}$ through the second and fourth intermediate currents $I_{AB1}$ and $I_{BB1}$.

From the above description, it can be understood that, when the first intermediate current $I_{AA1}$ is selected, the second intermediate current $I_{AB1}$ is cut off, and when the first intermediate current $I_{AA1}$ is cut off, the second intermediate current $I_{AB1}$ is selected. It can be understood likely that, when the third intermediate current $I_{BA1}$ is selected, the fourth intermediate current $I_{BB1}$ is cut off, and when the third intermediate current $I_{BA1}$ is cut off, the fourth intermediate current $I_{BB1}$ is selected. Therefore, the first mute control current $I_{out-A1}$ and the second mute control current $I_{out-B1}$ have the same amplitude and different polarities.

When the above description for the first and second selecting and combining circuits $213_{A1}$ and $213_{B1}$ is applied to the third and fourth selecting and combining circuits $213_{A2}$ and $213_{B2}$, the first mute signal $M_1$ will be renamed to the second mute signal $M_2$, the first delayed mute signal $DM_1$ will be renamed to the second delayed mute signal $DM_2$, and the first to fourth intermediate currents $I_{AA1}$ and $I_{BB1}$ will be renamed to the fifth to eighth intermediate currents $I_{AA2}$ to $I_{BB2}$ respectively.

Figure 4:
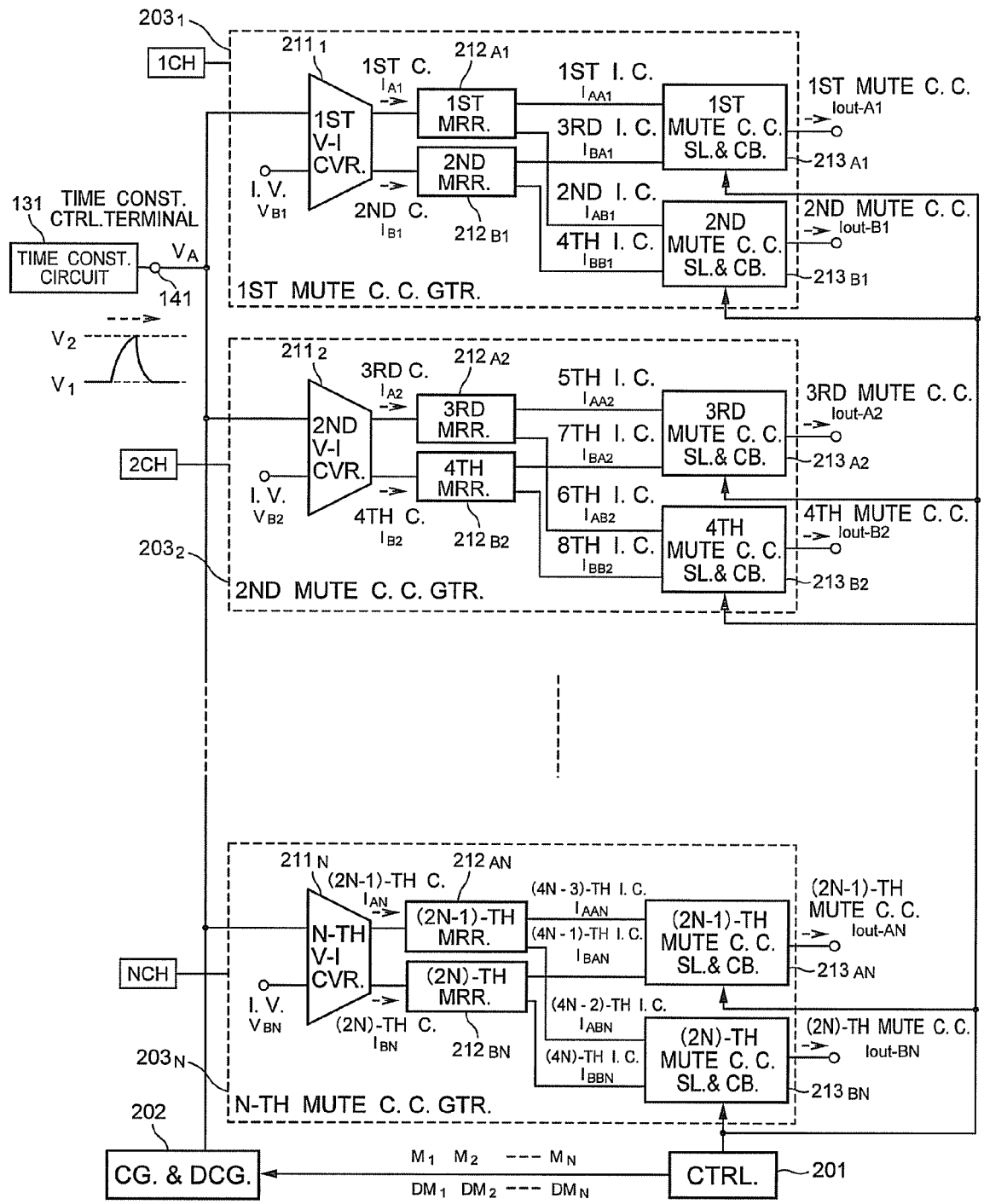
FIG. 4 is a block diagram of an integrated circuit device according to the modified embodiment.

The integrated circuit device 111 in this embodiment may be configured for an audio system 101 having two channels as illustrated in FIG. 3, or may be configured for an audio system 101 having three or more channels as illustrated in FIG. 4. It is assumed here that a structure and operations of each channel of FIG. 4 are the same as those of each channel of FIG. 3. Hereinafter, while the structure and the operations of the integrated circuit device 111 of FIG. 3 will be described, the following description can also be applied to the integrated circuit device 111 of FIG. 4. It is assumed that "N" in FIG. 4 is an integer of 3 or greater. Names of each block and each signal of FIG. 4 are shown in FIG. 4.

Figure 5A:
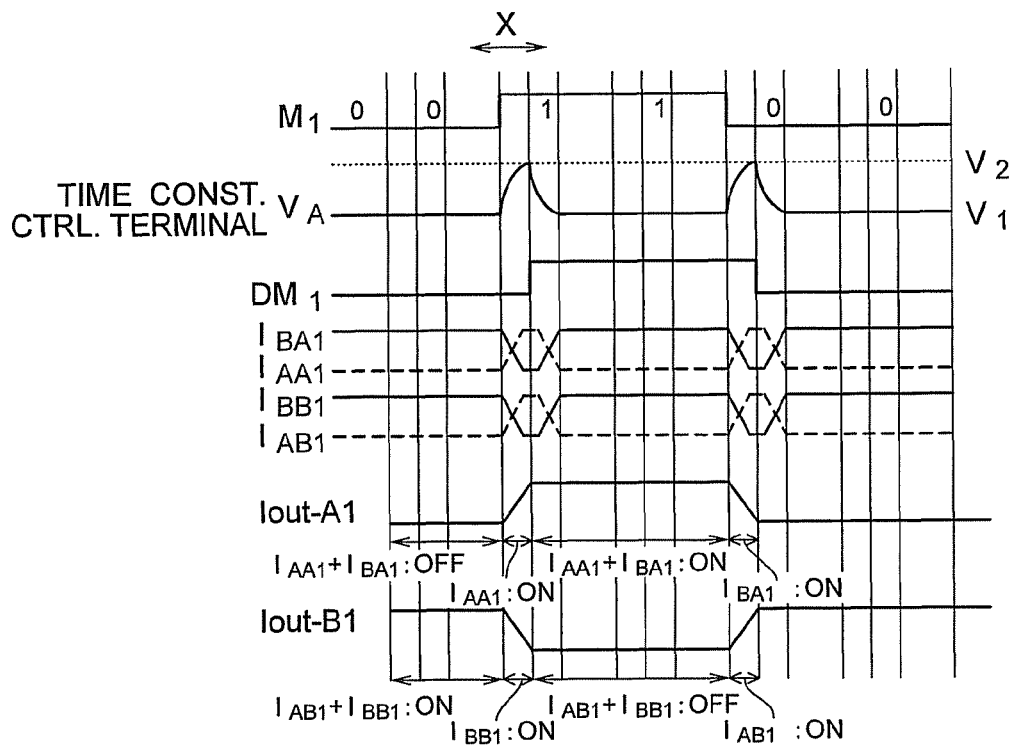
FIG. 5A is a waveform chart for describing an example of operations of the integrated circuit device in FIG. 3.
Figure 5B:
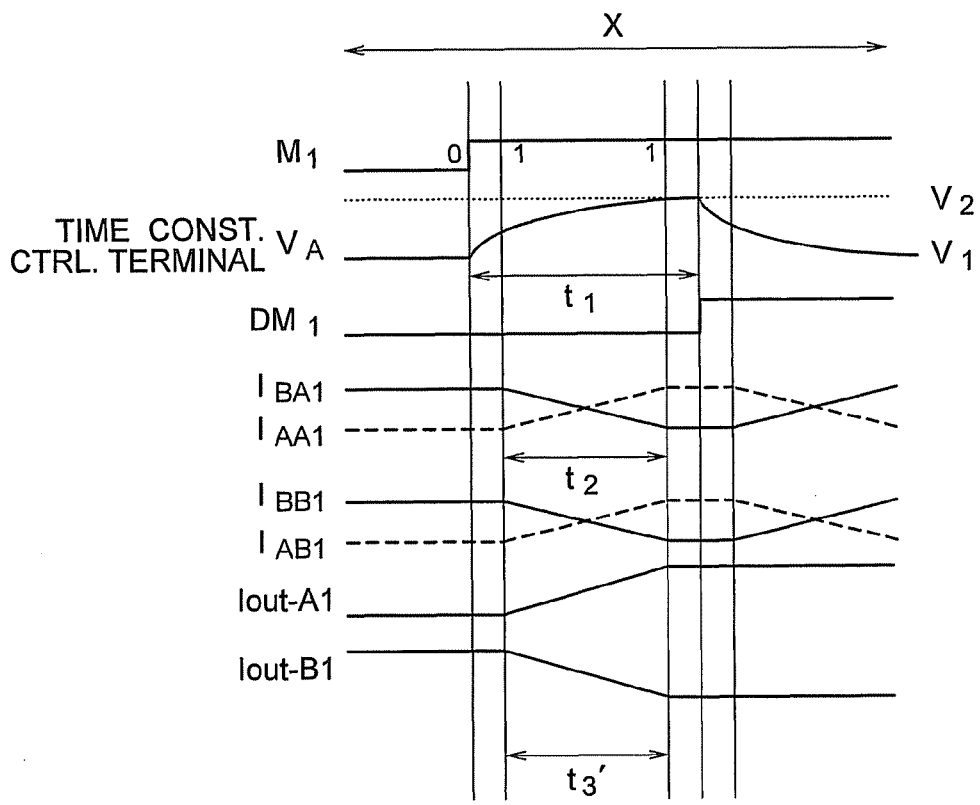
FIG. 5B is a waveform chart in which an area X of the waveform chart in FIG. 5A is expanded.

FIG. 5A is a waveform chart for describing an example of operations of the integrated circuit device 111 in FIG. 3. FIG. 5B is a waveform chart in which an area X of the waveform chart in FIG. 5A is expanded.

The switching from the mute state to the sound output state will be described. When the first CH is in the mute state, both of $M_1$ and $DM_1$ are "L" levels.

First, the control circuit 201 switches $M_1$ from "L" level to "H" level. In response to the switching of $M_1$, the charging and discharging circuit 202 starts charging the time constant control terminal 141. The time constant control terminal 141 is continued to be charged until the voltage $V_A$ on the time constant control terminal 141 is changed from the first reference voltage $V_1$ to the second reference voltage $V_2$. Since the time constant control terminal 141 is connected to the time constant circuit 131, the voltage $V_A$ on the time constant control terminal 141 is slowly increased.

Before the voltage $V_A$ is changed from $V_1$ to $V_2$, the first V-I converting circuit $211_1$ switches between a value of $I_{A1}$ and a value of $I_{B1}$. Thereby, as illustrated in FIGS. 5A and 5B, a value of $I_{AA1}$ and a value of $I_{BA1}$ are switched, and a value of $I_{AB1}$ and a value of $I_{BB1}$ are switched. When the voltage $V_A$ on the time constant control terminal 141 becomes equal to the intermediate voltage $V_{B1}$, a relation between $I_{A1}$ and $I_{B1}$ becomes $I_{A1}=I_{B1}$ ($I_{AA1}=I_{BA1}$, $I_{AB1}=I_{BB1}$).

On the other hand, in response to the switching of $M_1$, the first selecting and combining circuit 213$_{A1}$ operates to select and cut off $I_{AA1}$ and $I_{BA1}$ respectively, and the second selecting and combining circuit 213$_{B1}$ operates to cut off and select $I_{AB1}$ and $I_{BB1}$ respectively. Thereby, as illustrated in FIGS. 5A and 5B, $I_{out-A1}$ becomes $I_{AA1}$, and $I_{out-B1}$ becomes $I_{BB1}$.

Next, the control circuit 201 switches $DM_1$ from "L" level to "H" level, triggered by a fact that the VA has reached $V_2$. As illustrated in FIG. 5B, it is assumed that a period from the switching of $M_1$ to the switching of $DM_1$ is $t_1$. As described later, the time $t_1$ corresponds to a period from the time when the time constant control terminal 141 is started to be charged to the time when the time constant control terminal 141 is started to be discharged, that is, corresponds to a period for charging the time constant control terminal 141.

As described above, the first V-I converting circuit 211$_1$ switches between the value of $I_{A1}$ and the value of $I_{B1}$, before the $V_A$ is changed from $V_1$ to $V_2$. That is, the first V-I converting circuit 211$_1$ switches between the value of $I_{A1}$ and the value of $I_{B1}$ within the time $t_1$. As described here, the first V-I converting circuit 211$_1$ needs to switch between the value of $I_{A1}$ and the value of $I_{B1}$ within the time $t_1$, and is designed so as to carry out such a switching. Therefore, assuming that this switching period is $t_2$, a relation between $t_1$ and $t_2$ becomes $t_1 > t_2$. Therefore, $DM_1$ is switched after the completion of switching between the value of $I_{A1}$ and the value of $I_{B1}$.

Furthermore, as described above, in response to the switching of $M_1$, the first selecting and combining circuit 213$_{A1}$ operates to select and cut off $I_{AA1}$ and $I_{BA1}$ respectively, and the second selecting and combining circuit 213$_{B1}$ operates to cut off and select $I_{AB1}$ and $I_{BB1}$ respectively. Therefore, assuming that a period for switching between a value of $I_{out-A1}$ and a value of $I_{out-B1}$ is $t_3'$, this switching time $t_3'$ also becomes $t_2$ (that is, $t_3'=t_2$) as illustrated in FIG. 5B.

Hereinafter, an operation after $DM_1$ is switched will be described.

In response to the switching of $DM_1$, the charging and discharging circuit 202 starts discharging the time constant control terminal 141. The time constant control terminal 141 is continued to be discharged until the voltage $V_A$ on the time constant control terminal 141 is changed from the second reference voltage $V_2$ to the first reference voltage $V_1$. Since the time constant control terminal 141 is connected to the time constant circuit 131, the voltage $V_A$ on the time constant control terminal 141 is slowly decreased.

On the other hand, in response to the switching of $DM_1$, the first selecting and combining circuit 213$_{A1}$ operates to select both of $I_{AA1}$ and $I_{BA1}$, and the second selecting and combining circuit 213$_{B1}$ operates to cut off both of $I_{AB1}$ and $I_{BB1}$. Thereby, as illustrated in FIGS. 5A and 5B, $I_{out-A1}$ becomes $I_{AA1}+I_{BA1}$, and $I_{out-B1}$ becomes "0".

As described above, the first CH is switched from the mute state to the sound output state. A period before the time $t_2$ corresponds to a period in the mute state, a period after the time $t_2$ corresponds to a period in the sound output state, and the time $t_2$ corresponds to a period for switching from the mute state to the sound output state. The above description can also be applied to the second CH.

The switching from the sound output state to the mute state will be described. When the first CH is in the sound output state, both of $M_1$ and $DM_1$ are "H" levels.

First, the control circuit 201 switches $M_1$ from "H" level to "L" level. In response to the switching of $M_1$, the charging and discharging circuit 202 starts charging the time constant control terminal 141. The time constant control terminal 141 is continued to be charged until the voltage $V_A$ on the time constant control terminal 141 is changed from the first reference voltage $V_1$ to the second reference voltage $V_2$. Since the time constant control terminal 141 is connected to the time constant circuit 131, the voltage $V_A$ on the time constant control terminal 141 is slowly increased.

Before the voltage $V_A$ is changed from $V_1$ to $V_2$, the first V-I converting circuit 211$_1$ switches between the value of $I_{A1}$ and the value of $I_{B1}$. Thereby, as illustrated in FIG. 5A, the value of $I_{AA1}$ and the value of $I_{BA1}$ are switched, and the value of $I_{AB1}$ and the value of $I_{BB1}$ are switched. When the voltage $V_A$ on the time constant control terminal 141 becomes equal to the intermediate voltage $V_{B1}$, a relation between $I_{A1}$ and $I_{B1}$ becomes $I_{A1}=I_{B1}$ ($I_{AA1}=I_{BA1}$, $I_{AB1}=I_{BB1}$).

On the other hand, in response to the switching of $M_1$, the first selecting and combining circuit 213$_{A1}$ operates to cut off and select $I_{AA1}$ and $I_{BA1}$ respectively, and the second selecting and combining circuit 213$_{B1}$ operates to select and cut off $I_{AB1}$ and $I_{BB1}$ respectively. Thereby, as illustrated in FIG. 5A, $I_{out-A1}$ becomes $I_{BA1}$, and $I_{out-B1}$ becomes $I_{AB1}$.

Next, the control circuit 201 switches $DM_1$ from "H" level to "L" level, triggered by a fact that the $V_A$ has reached $V_2$. It is assumed that a period from the switching of $M_1$ to the switching of $DM_1$ is $t_1$. The time $t_1$ corresponds to a period from the time when the time constant control terminal 141 is started to be charged to the time when the time constant control terminal 141 is started to be discharged, that is, corresponds to a period for charging the time constant control terminal 141.

As described above, the first V-I converting circuit 211$_1$ switches between the value of $I_{A1}$ and the value of $I_{B1}$, before the voltage $V_A$ is changed from $V_1$ to $V_2$. That is, the first V-I converting circuit 211$_1$ switches between the value of $I_{A1}$ and the value of $I_{B1}$ within the time $t_1$. As described here, the first V-I converting circuit 211$_1$ needs to switch between the value of $I_{A1}$ and the value of $I_{B1}$ within the time $t_1$, and is designed so as to carry out such switching. Therefore, assuming that this switching period is $t_2$, a relation between $t_1$ and $t_2$ becomes $t_1 > t_2$. Therefore, $DM_1$ is switched after the completion of switching between the value of $I_{A1}$ and the value of $I_{B1}$.

Furthermore, as described above, in response to the switching of $M_1$, the first selecting and combining circuit 213$_{A1}$ operates to cut off and select $I_{AA1}$ and $I_{BA1}$ respectively, and the second selecting and combining circuit 213$_{B1}$ operates to select and cut off $I_{AB1}$ and $I_{BB1}$ respectively. Therefore, assuming that a period for switching between the value of $I_{out-A1}$ and the value of $I_{out-B1}$ is $t_3'$, this switching time $t_3'$ also becomes $t_2$ (that is, $t_3'=t_2$).

Hereinafter, an operation after $DM_1$ is switched will be described.

In response to the switching of $DM_1$, the charging and discharging circuit 202 starts discharging the time constant control terminal 141. The time constant control terminal 141 is continued to be discharged until the voltage $V_A$ on the time constant control terminal 141 is changed from the second reference voltage $V_2$ to the first reference voltage $V_1$. Since the time constant control terminal 141 is connected to the time constant circuit 131, the voltage $V_A$ on the time constant control terminal 141 is slowly decreased.

On the other hand, in response to the switching of $DM_1$, the first selecting and combining circuit 213$_{A1}$ operates to cut off both of $I_{AA1}$ and $I_{BA1}$, and the second selecting and combining circuit 213$_{B1}$ operates to select both of $I_{AB1}$ and $I_{BB1}$. Thereby, as illustrated in FIG. 5A, $I_{out-A1}$ becomes "0", and $I_{out-B1}$ becomes $I_{AB1}+I_{BB1}$.

As described above, the first CH is switched from the sound output state to the mute state. A period before the time $t_2$ corresponds to a period in the sound output state, a period after the time $t_2$ corresponds to a period in the mute state, and the time $t_2''$ corresponds to a period for switching from the sound output state to the mute state. The above description can also be applied to the second CH.

Here, the integrated circuit device 111 of a comparative example will be exemplified.

Figure 6:
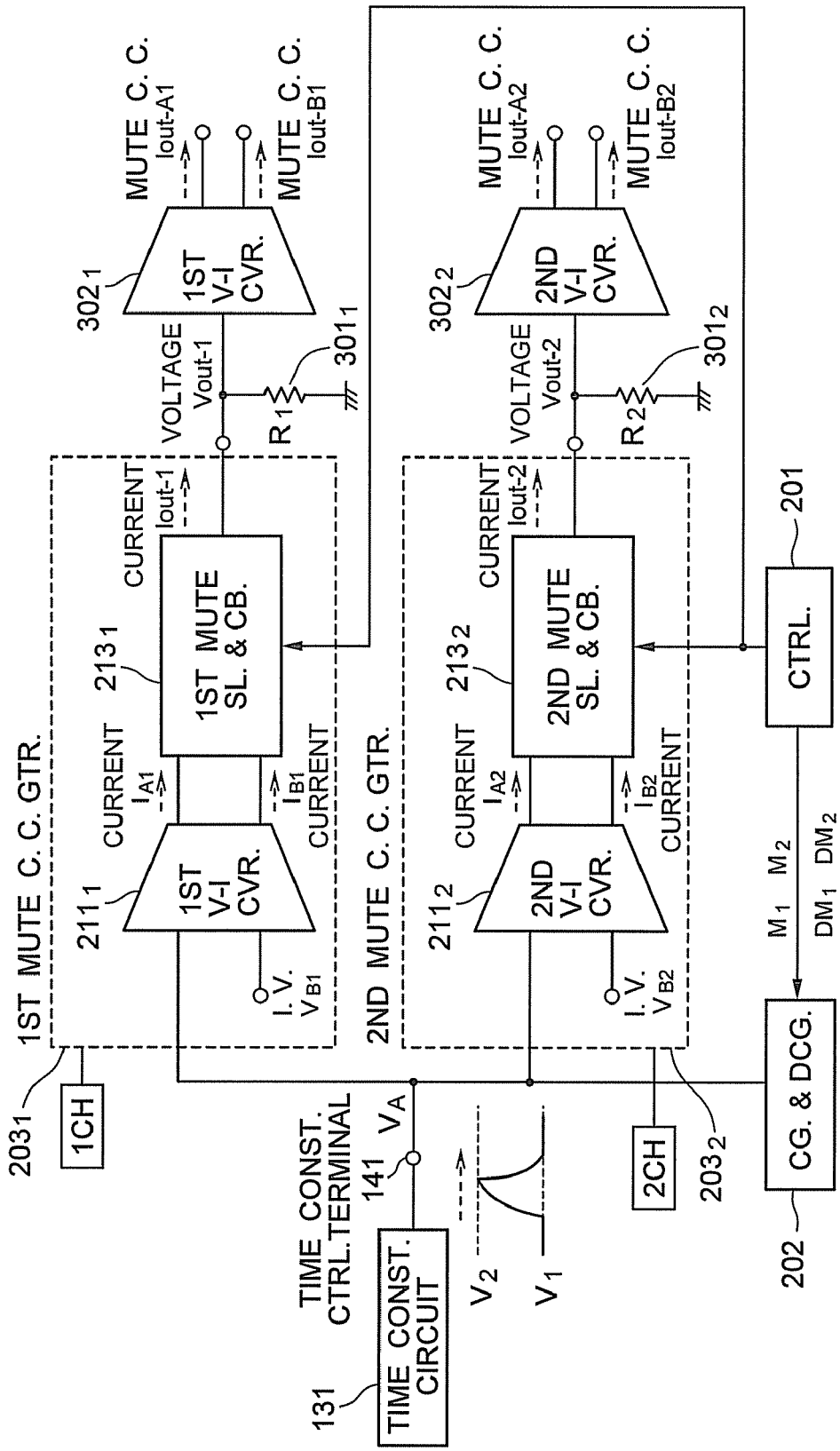
FIG. 6 is a block diagram of an integrated circuit device according to a comparative example.
Figure 7A:
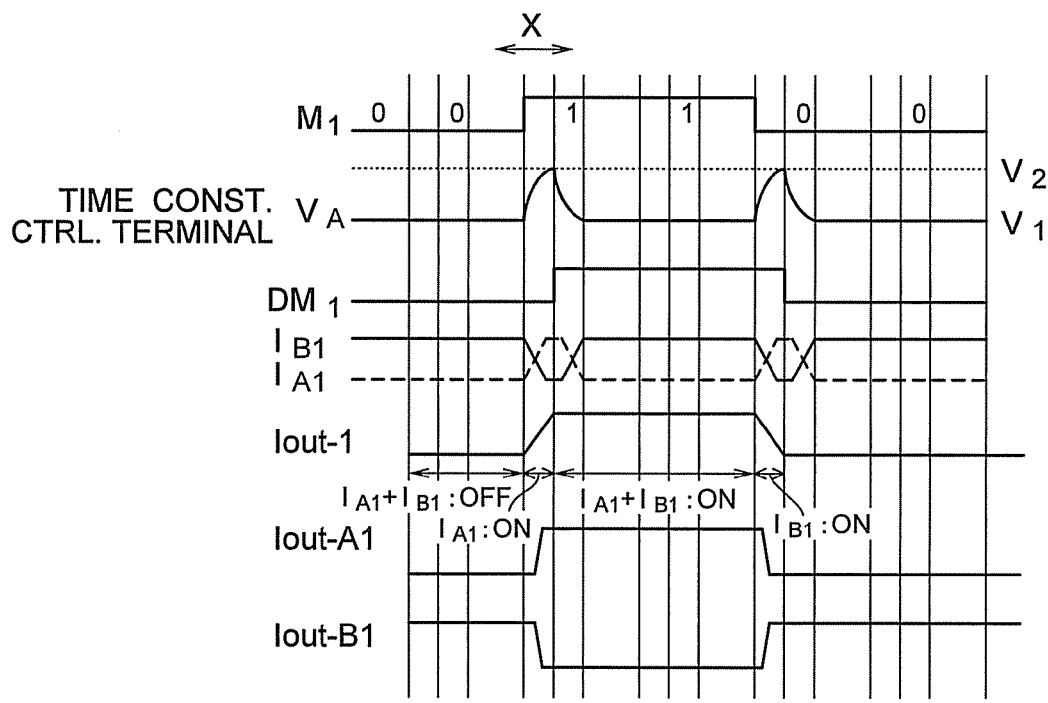
FIG. 7A is a waveform chart for describing an example of operations of the integrated circuit device in FIG. 6.
Figure 7B:
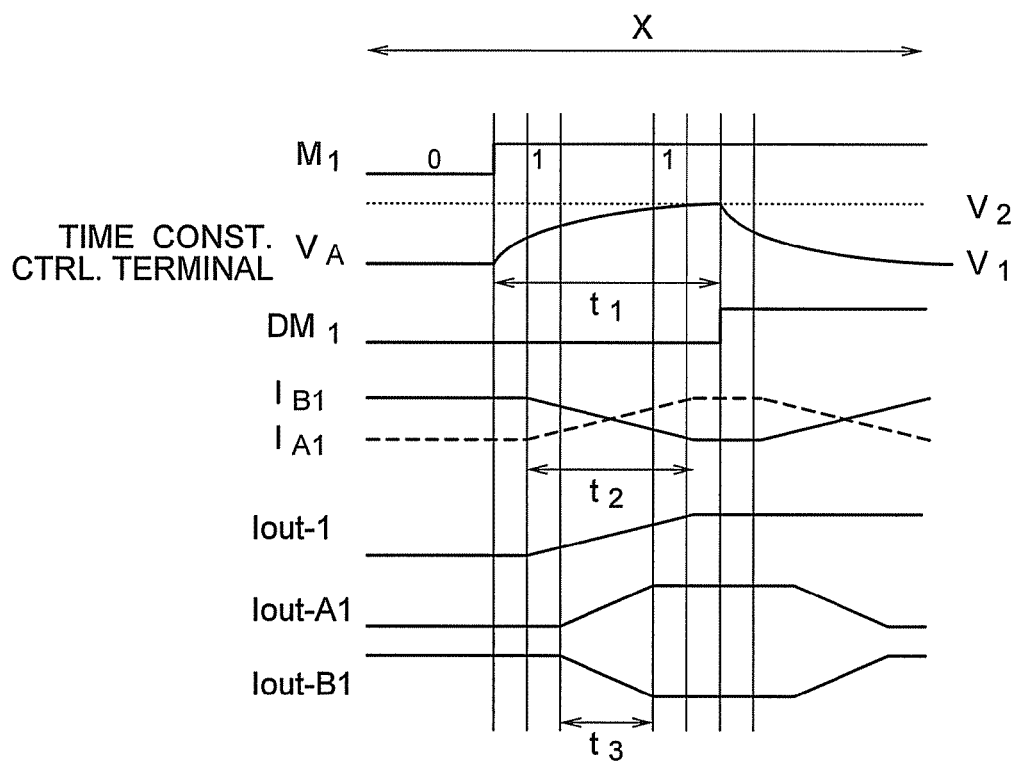
FIG. 7B is a waveform chart in which an area X of the waveform chart in FIG. 7A is expanded.

FIG. 6 is a block diagram of the integrated circuit device 111 of the comparative example. FIG. 7A is a waveform chart for describing an example of operations of the integrated circuit device 111 in FIG. 6. FIG. 7B is a waveform chart in which an area X of the waveform chart in FIG. 7A is expanded.

The integrated circuit device 111 of FIG. 6 includes first and second selecting and combining circuits $213_1$ and $213_2$, first and second resistors $301_1$ and $301_2$, and first and second V-I converting circuits (Gm amplifiers) $302_1$ and $302_2$, instead of the first to fourth mirror circuits $212_{A1}$ to $212_{B2}$, and the first to fourth selecting and combining circuits $213_{A1}$ to $213_{B2}$.

The first V-I converting circuit $211_1$ of FIG. 6 generates the currents $I_{A1}$ and $I_{B1}$, similar to the first V-I converting circuit $211_1$ of FIG. 3. The first selecting and combining circuit $213_1$ of FIG. 6 selectively combines the current $I_{A1}$ and the current $I_{B1}$ to generate a current $I_{out-1}$. As illustrated in FIGS. 7A and B, a waveform of the current $I_{out-1}$ in the comparative example is the same as that of the current $I_{out-A1}$ in this embodiment. The first resistor $301_1$ converts the current $I_{out-1}$ to a voltage $V_{out-1}$. The first V-I converting circuit $302_1$ generates the mute control currents $I_{out-A1}$ and $I_{out-B1}$ using the voltage $V_{out-1}$.

FIG. 7B illustrates the times $t_1$, $t_2$, and $t_3$. The time $t_1$ is a period for charging the time constant control terminal 141. The time constant control terminal 141 is charged by the charging and discharging circuit 202. The time $t_2$ is a period for switching between the value of $I_{A1}$ and the value of $I_{B1}$. The values of $I_{A1}$ and $I_{B1}$ are switched by the first V-I converting circuit $211_1$. Since it is necessary to switch between the values of $I_{A1}$ and $I_{B1}$ within the time $t_1$, a relation between $t_1$ and $t_2$ becomes $t_1 > t_2$. The time $t_3$ is a period for switching between the value of $I_{out-A1}$ and the value of $I_{out-B1}$. The values of $I_{out-A1}$ and $I_{out-B1}$ are switched by the first V-I converting circuit $302_1$. Since it is necessary to switch between the values of $I_{out-A1}$ and $I_{out-B1}$ within the time $t_2$, a relation between $t_2$ and $t_3$ becomes $t_2 > t_3$. Therefore, the relation $t_1 > t_2 > t_3$ is true as a relation between $t_1$, $t_2$, and $t_3$.

Here, the embodiment of FIG. 3 and the comparative example of FIG. 6 will be compared.

In the comparative example of FIG. 6, time required for switching between the sound output state and the mute state is $t_3$. In the comparative example, $t_3$ is restricted by the relation $t_1 > t_2 > t_3$. On the other hand, in the embodiment of FIG. 3, time required for switching between the sound output state and the mute state is $t_2$. In the embodiment, $t_2$ is restricted by the relation $t_1 > t_2$. It is noted that $t_1$ is a time required for charging, and $t_2$ is a time required for selecting and combining, in both cases.

It is desirable that a time required for switching between the sound output state and the mute state is as long as possible. This is because the shorter switching time causes rapid switching between the sound output state and the mute state, so that the effect on the pop sound reduction is decreased. From such a viewpoint, the embodiment of FIG. 3 may be superior to the comparative example of FIG. 6. This is because the above restriction for the switching time of the embodiment of FIG. 3 is smaller than that of the comparative example of FIG. 6, as described above.

As described above, in the embodiment of FIG. 3, the mute control currents $I_{out-A1}$ and $I_{out-B1}$ whose polarities are different from each other are generated. Since the polarities of $I_{out-A1}$ and $I_{out-B1}$ are different from each other, such a feature is realized that the sound output state and the mute state of the first CH do not appear at the same time. This is also the same in the mute control currents $I_{out-A2}$ and $I_{out-B2}$.

On the other hand, such a feature is also realized in the comparative example of FIG. 6. However, in the comparative example of FIG. 6, it is necessary to provide the integrated circuit device 111 with the first and second V-I converting circuits $302_1$ and $302_2$, in order to realize such a feature. Therefore, in the comparative example of FIG. 6, such V-I converting circuits $302_1$ and $302_2$ result in increasing an IC chip area. On the other hand, in the embodiment of FIG. 3, it is not necessary to provide the integrated circuit device 111 with such a V-I converting circuit. Therefore, in the embodiment of FIG. 3, it is possible to prevent the IC chip area from being increased, and it is possible to accelerate the pop sound to be reduced.

In this embodiment, regarding $M_1$ and $DM_1$, while the low level and the high level are designated to be a first logical level and a second logical level respectively, the high level and the low level may be designated to be the first logical level and the second logical level respectively. This is the same for $M_2$ and $DM_2$.

This embodiment can be applied not only to the audio system and the integrated circuit device having two or more channels, but also to an audio system and an integrated circuit device having one channel. In the audio system and the integrated circuit device having two or more channels, the time constant circuit 131 and the time constant control terminal 141 can advantageously be shared.

(First Example of Circuit Configuration)

Figure 8A:
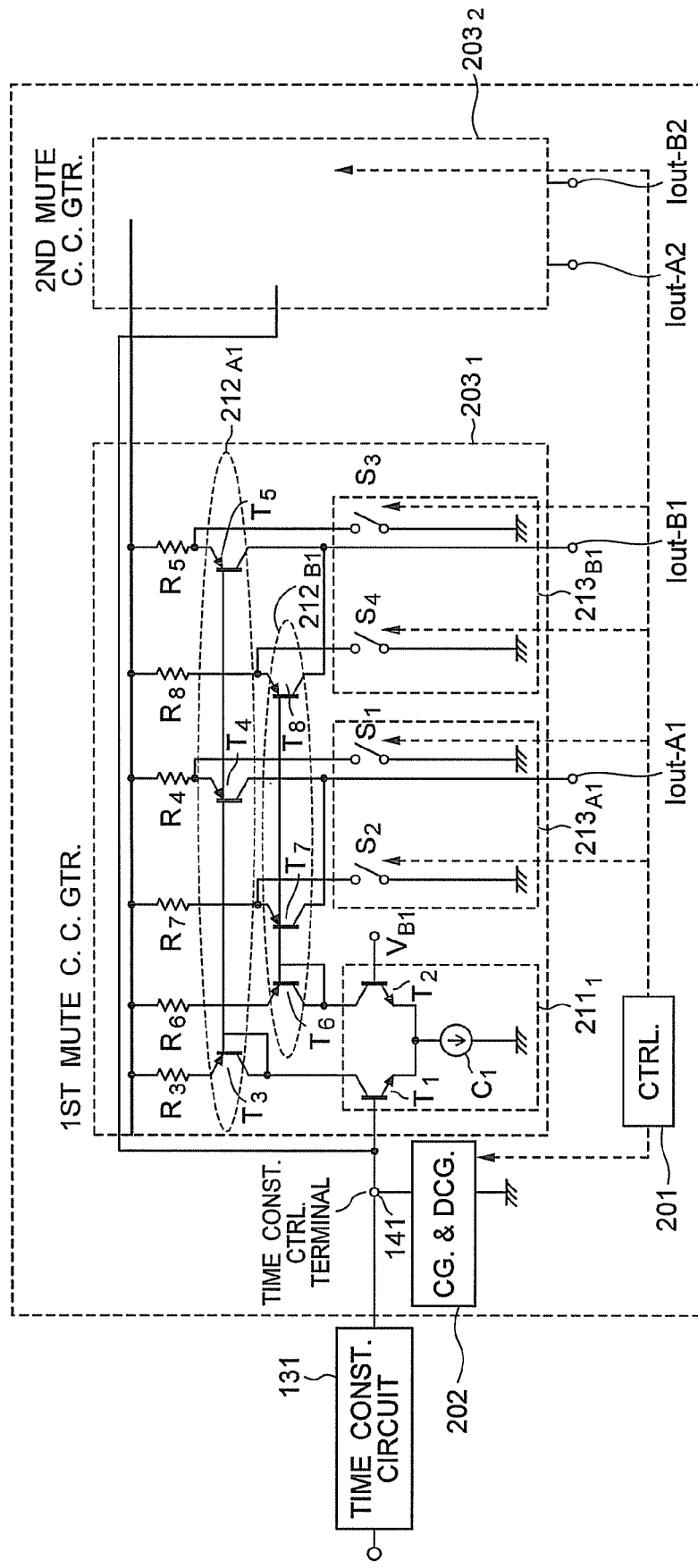
FIG. 8A shows a first example of a circuit configuration of the integrated circuit device.

FIG. 8A shows a first example of the circuit configuration of the integrated circuit device 111 in FIG. 3. FIG. 8A shows the control circuit 201, the charging and discharging circuit 202, the first control current generating circuit $203_1$, and the second control current generating circuit $203_2$. FIG. 8A further shows the time constant circuit 131 and the time constant control terminal 141.

While it is assumed here that the time constant circuit 131 is connected externally to the integrated circuit device 111, the time constant circuit 131 may be incorporated in the integrated circuit device 111 in some cases. When the time constant circuit 131 is externally connected, it is configured, for example, with a resistor element, a capacitor, and the like. It is assumed here that a time constant of the time constant circuit 131 is 10 to 100 msec. While the charging and discharging circuit 202 is not operating, the time constant control terminal 141 is provided with a voltage which is not detected by the first and second control current generating circuits $203_1$ and $203_2$.

FIG. 8A further illustrates a circuit configuration of the first control current generating circuit $203_1$. The first control current generating circuit $203_1$ includes the first V-I converting circuit $211_1$, the first and second mirror circuits $212_{A1}$ and $212_{B1}$, and the first and second selecting and combining circuits $213_{A1}$ and $213_{B1}$.

Figure 8B:
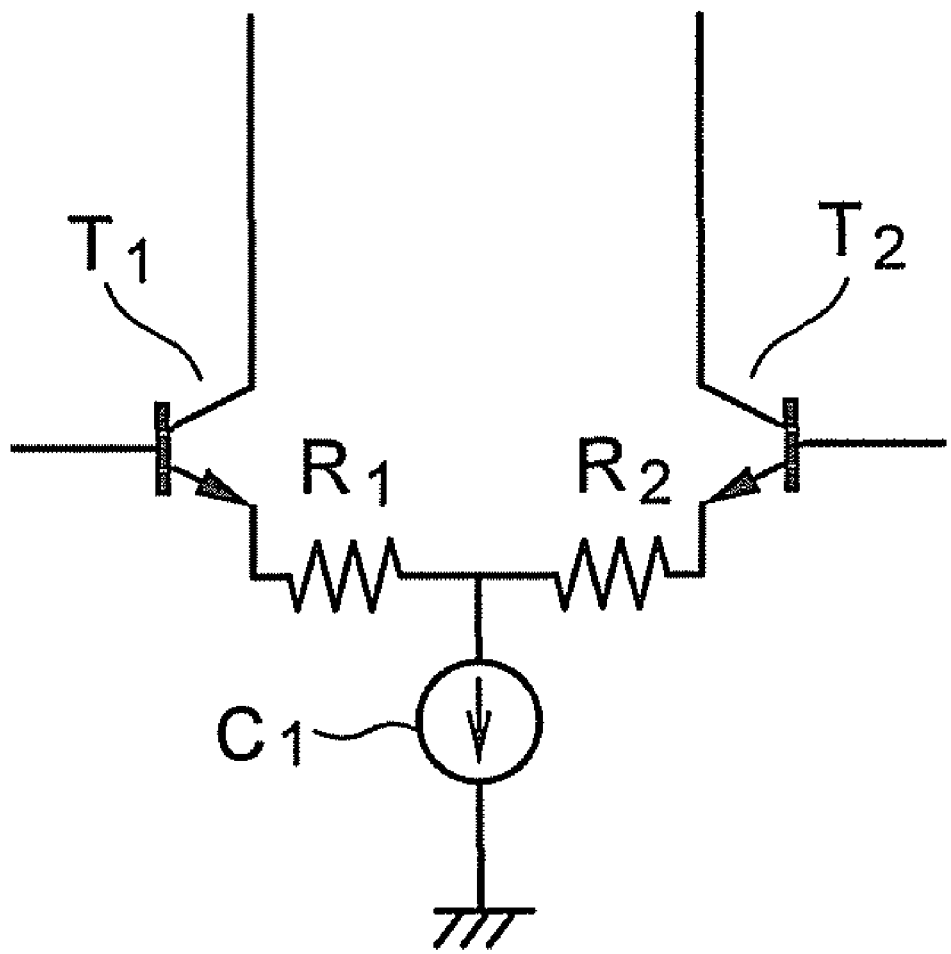
FIG. 8B shows a variation of a circuit configuration of a first V-I converting circuit.

The first V-I converting circuit $211_1$ includes a first current source $C_1$, a first transistor $T_1$, and a second transistor $T_2$. The transistor $T_1$ is connected to the current source $C_1$, the transistor $T_2$, and the time constant control terminal 141, and outputs the current $I_{A1}$. The transistor $T_2$ is connected to the current source $C_1$, the transistor $T_1$, and a terminal of the intermediate voltage $V_{B1}$, and outputs the current $I_{B1}$. FIG. 8B shows a variation of the circuit configuration of the first V-I converting circuit $211_1$. In FIG. 8B, a first resistor element $R_1$ is connected between an emitter of the transistor $T_1$ and the current source $C_1$. In FIG. 8B, a second resistor element $R_2$ is further connected between an emitter of the transistor $T_2$ and the current source $C_1$.

The first mirror circuit $212_{A1}$ includes a third transistor $T_3$, a fourth transistor $T_4$, and a fifth transistor $T_5$. The transistor $T_3$ is connected to the transistor $T_1$, and is provided with the current $I_{A1}$ from the transistor $T_1$. The transistor $T_4$ outputs the intermediate current $I_{AA1}$. The transistor $T_5$ outputs the intermediate current $I_{AB1}$. Third, fourth, and fifth resistor elements $R_3$, $R_4$, and $R_5$ are connected to the emitters of the transistors $T_3$, $T_4$, and $T_5$ respectively.

The second mirror circuit $212_{B1}$ includes a sixth transistor $T_6$, a seventh transistor $T_7$, and an eighth transistor $T_8$. The transistor $T_6$ is connected to the transistor $T_2$, and is provided with the current $I_{B1}$ from the transistor $T_2$. The transistor $T_7$ outputs the intermediate current $I_{BA1}$. The transistor $T_8$ outputs the intermediate current $I_{BB1}$. Sixth, seventh, and eighth resistor elements $R_6$, $R_7$, and $R_8$ are connected to the emitters of the transistors $T_6$, $T_7$, and $T_8$ respectively.

The first selecting and combining circuit $213_{A1}$ includes a first switch $S_1$ and a second switch $S_2$. The switch $S_1$ is provided for selecting or cutting off the intermediate current $I_{AA1}$. The switch $S_2$ is provided for selecting or cutting off the intermediate current $I_{BA1}$. The switches $S_1$ and $S_2$ are controlled by the control circuit 201.

The second selecting and combining circuit $213_{B1}$ includes a third switch $S_3$ and a fourth switch $S_4$. The switch $S_3$ is provided for selecting or cutting off the intermediate current $I_{AB1}$. The switch $S_4$ is provided for selecting or cutting off the intermediate current $I_{BB1}$. The switches $S_3$ and $S_4$ are controlled by the control circuit 201.

Each of the first to eighth transistors $T_1$ to $T_8$ is a bipolar transistor. In this example, the first and second transistors $T_1$ and $T_2$ are NPN-type transistors, and the third to eighth transistors $T_3$ to $T_8$ are PNP-type transistors.

Figure 8C:
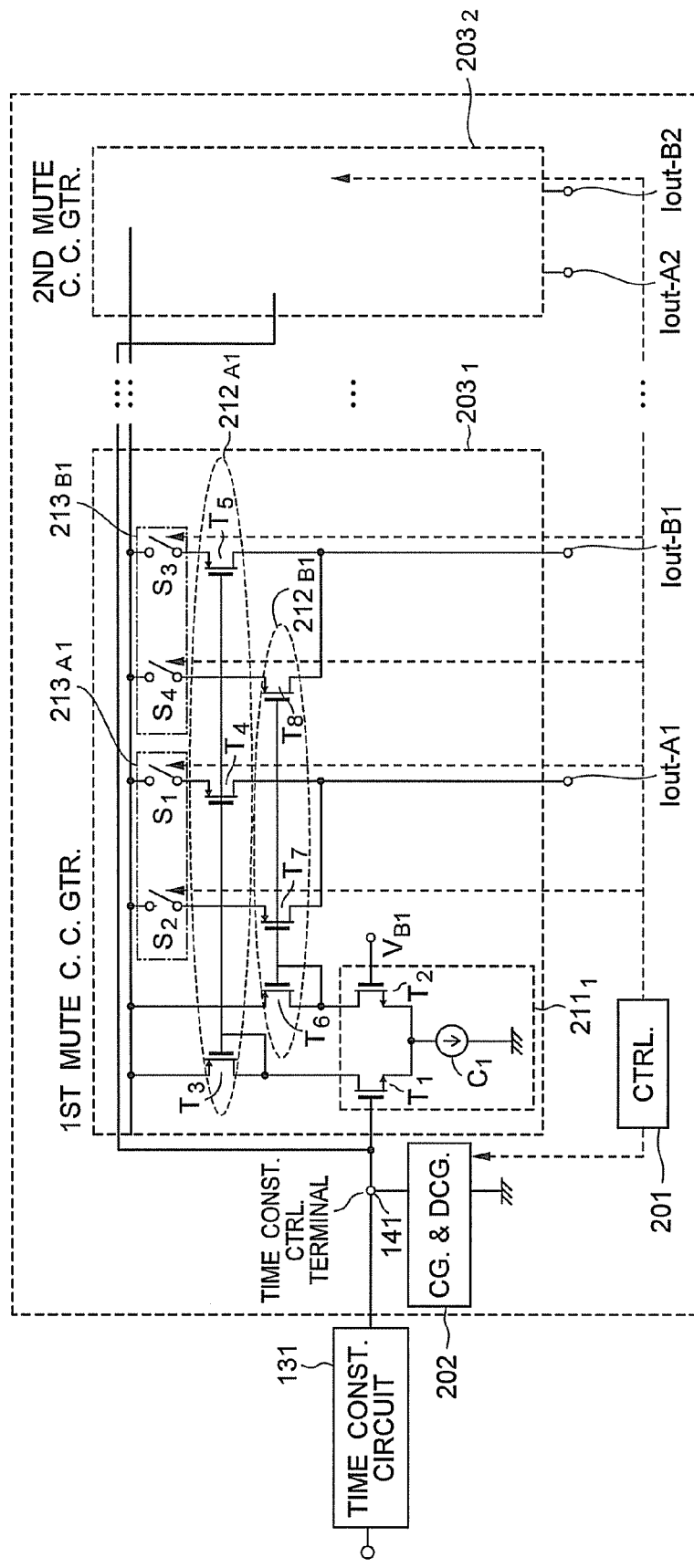
FIG. 8C shows a variation of the circuit configuration of FIG. 8A.

FIG. 8C shows a variation of the circuit configuration of FIG. 8A. In FIG. 8C, each of the first to eighth transistors $T_1$ to $T_8$ is a field-effect transistor. In FIG. 8C, the first and second transistors $T_1$ and $T_2$ are nMOS transistors, and the third to eighth transistors $T_3$ to $T_8$ are pMOS transistors. The connections of gates, sources, and drains of the first to eighth transistors $T_1$ to $T_8$ of FIG. 8C are the same as those of the first to eighth transistors $T_1$ to $T_8$ of FIG. 8A respectively.

Figure 8D:
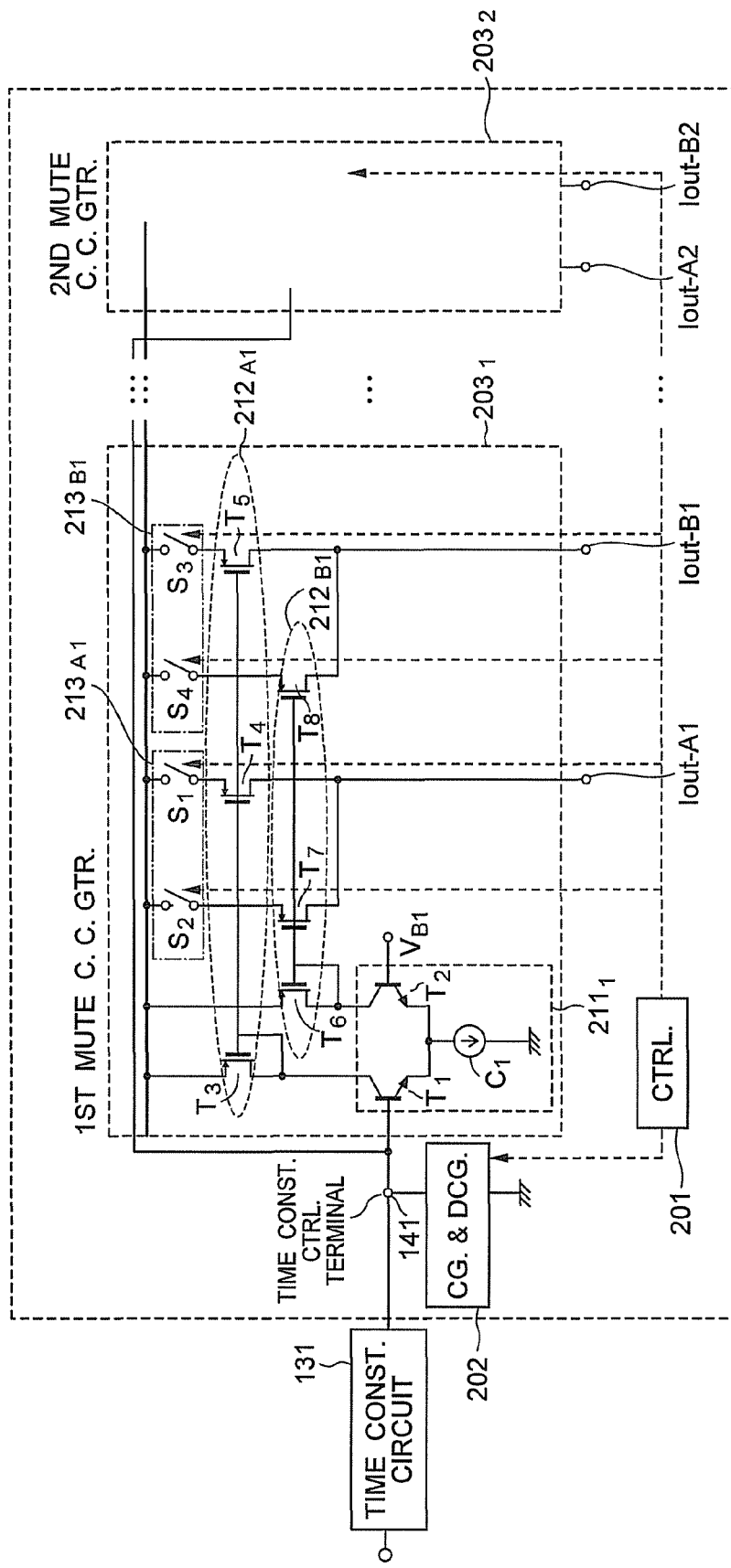
FIG. 8D shows another variation of the circuit configuration of FIG. 8A.

FIG. 8D shows another variation of the circuit configuration of FIG. 8A. In FIG. 8D, each of the first and second transistors $T_1$ and $T_2$ is a bipolar transistor, and each of the third to eighth transistors $T_3$ to $T_8$ is a field-effect transistor. In FIG. 8D, the first and second transistors $T_1$ and $T_2$ are the NPN-type transistors, and the third to eighth transistors $T_3$ to $T_8$ are the pMOS transistors. The connections of the gates, the sources, and the drains of the third to eighth transistors $T_3$ to $T_8$ of FIG. 8D are the same as those of the third to eighth transistors $T_3$ to $T_8$ of FIG. 8A respectively.

Figure 8E:
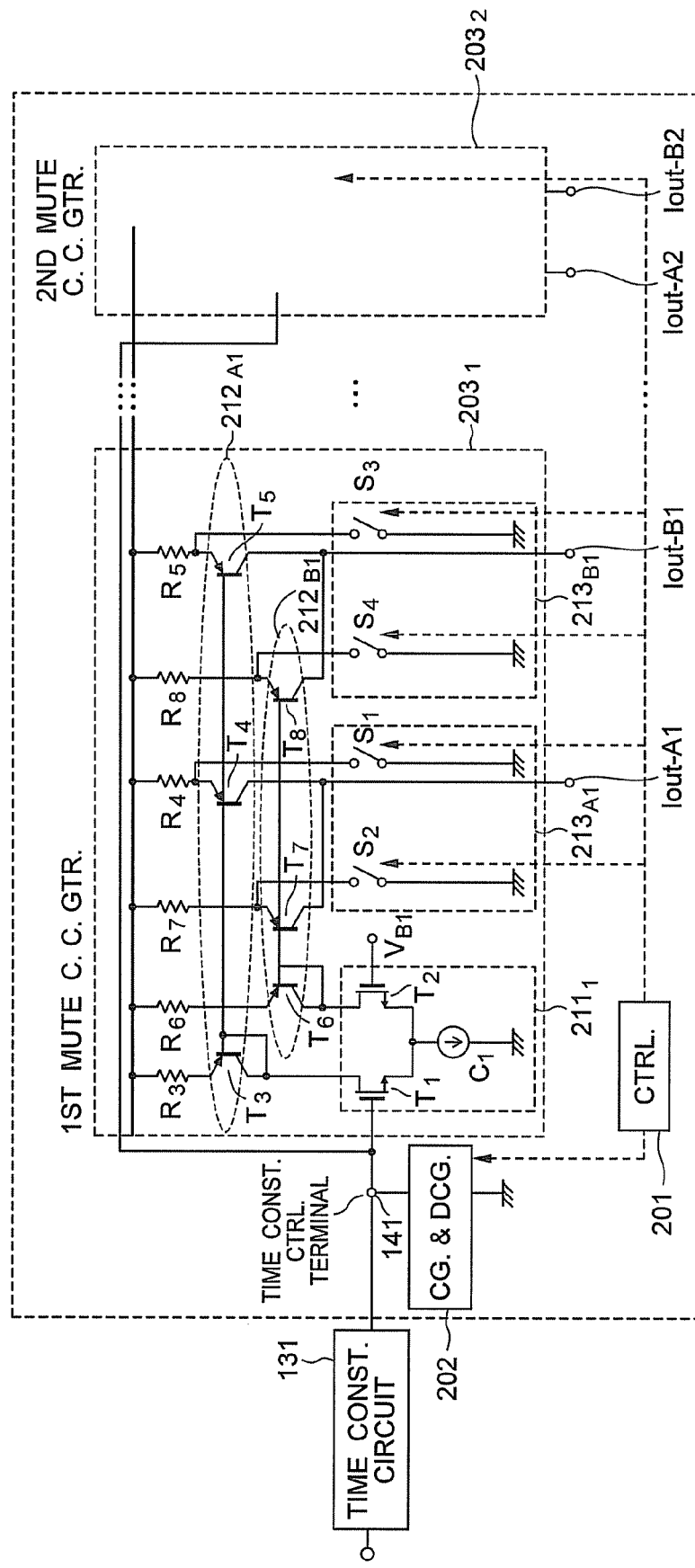
FIG. 8E shows another variation of the circuit configuration of FIG. 8A.

FIG. 8E shows another variation of the circuit configuration of FIG. 8A. In FIG. 8E, each of the first and second transistors $T_1$ and $T_2$ is a field-effect transistor, and each of the third to eighth transistors $T_3$ and $T_8$ is a bipolar transistor. In FIG. 8E, the first and second transistors $T_1$ to $T_2$ are the nMOS transistors, and the third to eighth transistors $T_3$ to $T_8$ are the PNP-type transistors. The connections of the gates, the sources, and the drains of the first and second transistors $T_1$ to $T_2$ of FIG. 8E are the same as those of the first and second transistors $T_1$ to $T_2$ of FIG. 8A respectively.

As described above, each of the first to eighth transistors $T_1$ to $T_8$ may be a bipolar transistor or a field-effect transistor. Combination of these transistors is not limited to the combinations of FIG. 8A, FIG. 8C, FIG. 8D, and FIG. 8E.

The above description can also be applied to the second control current generating circuit $203_2$. The second control current generating circuit $203_2$ includes a second current source $C_2$, ninth to sixteenth transistors $T_9$ to $T_{16}$, ninth to sixteenth resistor elements $R_9$ to $R_{16}$, and fifth to eighth switches $S_5$ to $S_8$. These circuit elements correspond to the first current source $C_1$, the first to eighth transistors $T_1$ to $T_8$, the first to eighth resistor elements $R_1$ to $R_8$, and the first to fourth switches $S_1$ to $S_4$ respectively.

Furthermore, the above description can also be applied to the N-th control current generating circuit $203_N$. The N-th control current generating circuit $203_N$ includes an N-th current source $C_N$, (8N−7)-th to (8N)-th transistors $T_{8N-7}$ to $T_{8N}$, (8N−7)-th to (8N)-th resistor elements $R_{8N-7}$ to $R_{8N}$, and (4N−3)-th to (4N)-th switches $S_{4N-3}$ to $S_{4N}$. These circuit elements correspond to the first current source $C_1$, the first to eighth transistors $T_1$ to $T_8$, the first to eighth resistor elements $R_1$ to $R_8$, and the first to fourth switches $S_1$ to $S_4$ respectively.

(Second Example of Circuit Configuration)

Figure 9A:
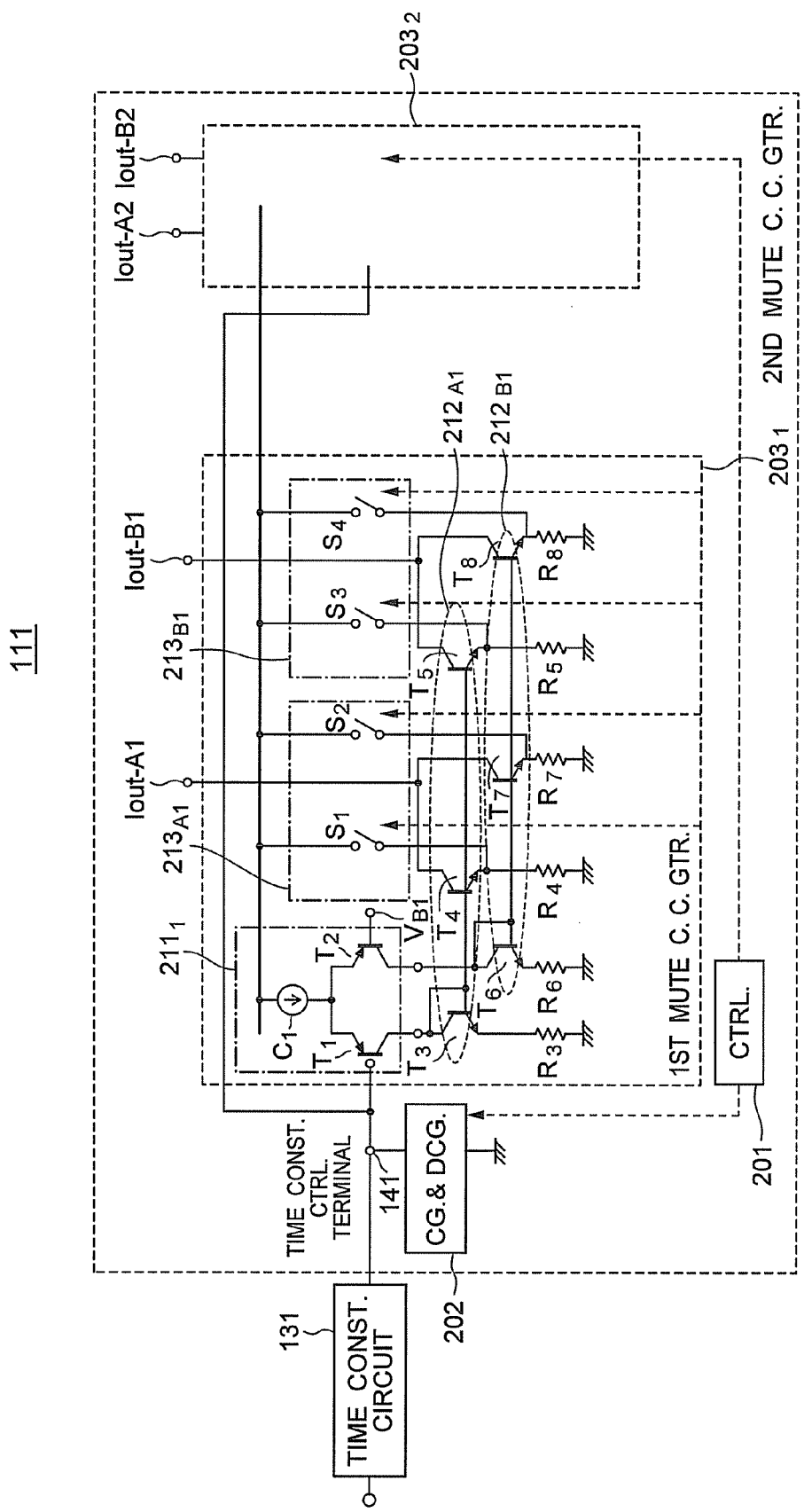
FIG. 9A shows a second example of a circuit configuration of the integrated circuit device.

FIG. 9A shows a second example of the circuit configuration of the integrated circuit device 111 in FIG. 3. FIG. 9A shows the control circuit 201, the charging and discharging circuit 202, the first control current generating circuit $203_1$, and the second control current generating circuit $203_2$. FIG. 9A further shows the time constant circuit 131 and the time constant control terminal 141. The circuit configuration of FIG. 9A is a variation of that of FIG. 8A, and it will be described as focusing on differences from that of FIG. 8A.

FIG. 9A further illustrates the circuit configuration of the first control current generating circuit $203_1$. The first control current generating circuit $203_1$ includes the first V-I converting circuit $211_1$, the first and second mirror circuits $212_{A1}$ and $212_{B1}$, and the first and second selecting and combining circuits $213_{A1}$ and $213_{B1}$.

Figure 9B:
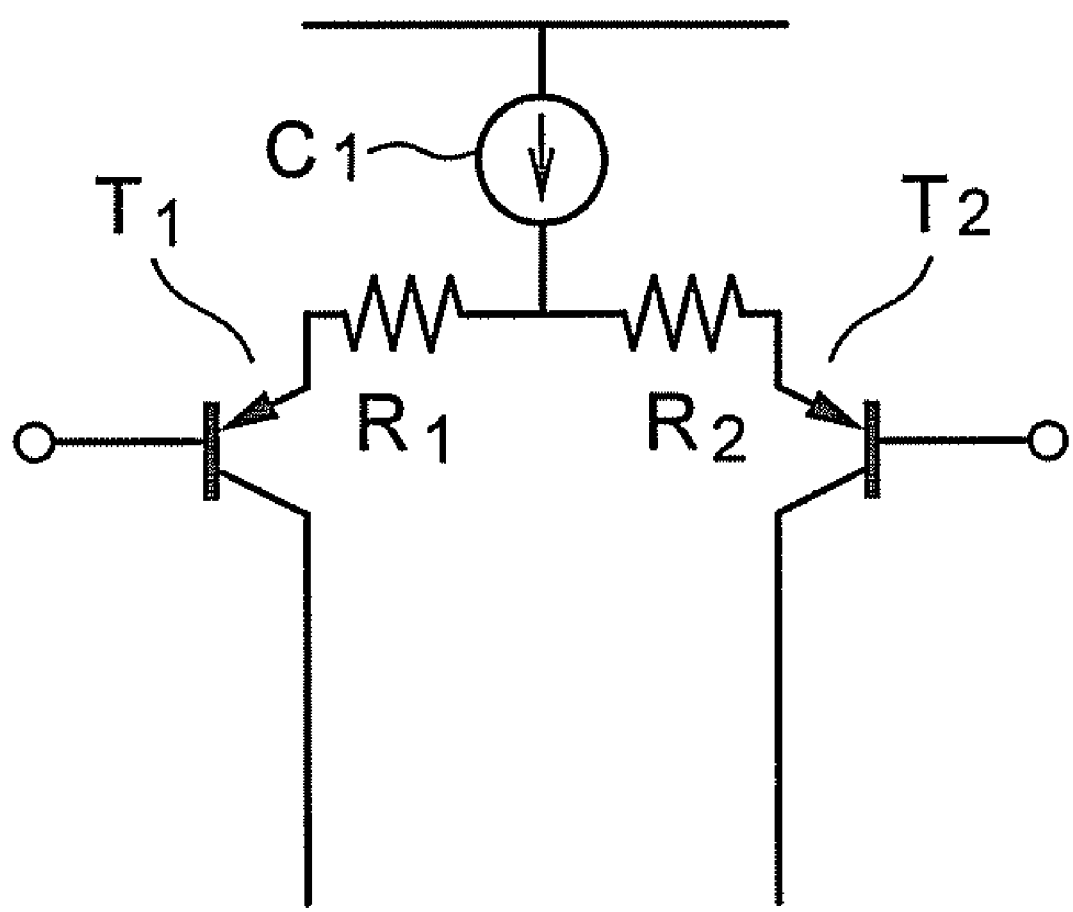
FIG. 9B shows a variation of a circuit configuration of the first V-I converting circuit.

The first V-I converting circuit $211_1$ includes the first current source $C_1$, the first transistor $T_1$, and the second transistor $T_2$. FIG. 9B shows a variation of the circuit configuration of the first V-I converting circuit $211_1$. In FIG. 9B, the first resistor element $R_1$ is connected between the emitter of the transistor $T_1$ and the current source $C_1$. In FIG. 9B, the second resistor element $R_2$ is connected between the emitter of the transistor $T_2$ and the current source $C_1$.

The first mirror circuit $212_{A1}$ includes the third transistor $T_3$, the fourth transistor $T_4$, and the fifth transistor $T_5$. The third, fourth, and fifth resistor elements $R_3$, $R_4$, and $R_5$ are connected to the emitters of the transistors $T_3$, $T_4$, and $T_5$ respectively.

The second mirror circuit $212_{B1}$ includes the sixth transistor $T_6$, the seventh transistor $T_7$, and the eighth transistor $T_8$. The sixth, seventh, and eighth resistor elements $R_6$, $R_7$, and $R_8$ are connected to the emitters of the transistors $T_6$, $T_7$, and $T_8$ respectively.

The first selecting and combining circuit $213_{A1}$ includes the first switch $S_1$, and the second switch $S_2$.

The second selecting and combining circuit $213_{B1}$ includes the third switch $S_3$, and the fourth switch $S_4$.

Each of the first to eighth transistors $T_1$ to $T_8$ is a bipolar transistor. In this example, the first and second transistors $T_1$ and $T_2$ are PNP-type transistors, and the third to eighth transistors $T_3$ to $T_8$ are NPN-type transistors.

Figure 9C:
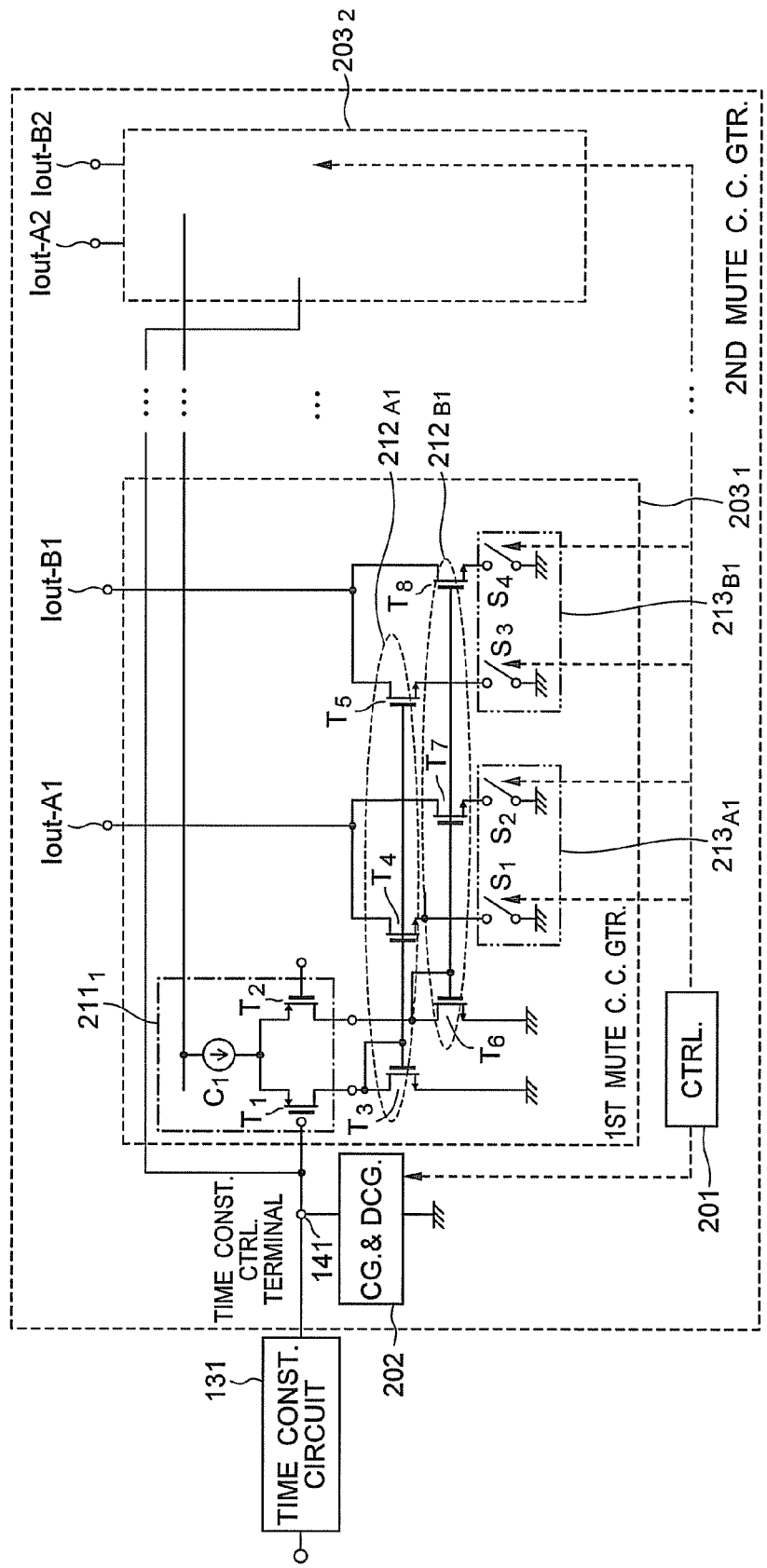
FIG. 9C shows a variation of the circuit configuration of FIG. 9A.

FIG. 9C shows a variation of the circuit configuration in FIG. 9A. In FIG. 9C, each of the first to eighth transistors $T_1$ to $T_8$ is a field-effect transistor. In FIG. 9C, the first and second transistors $T_1$ and $T_2$ are PMOS transistors, and the third to eighth transistors $T_3$ to $T_8$ are nMOS transistors. The connections of gates, sources, and drains of the first to eighth transistors $T_1$ to $T_8$ of FIG. 9C are the same as those of the first to eighth transistors $T_1$ to $T_8$ of FIG. 9A respectively.

Figure 9D:
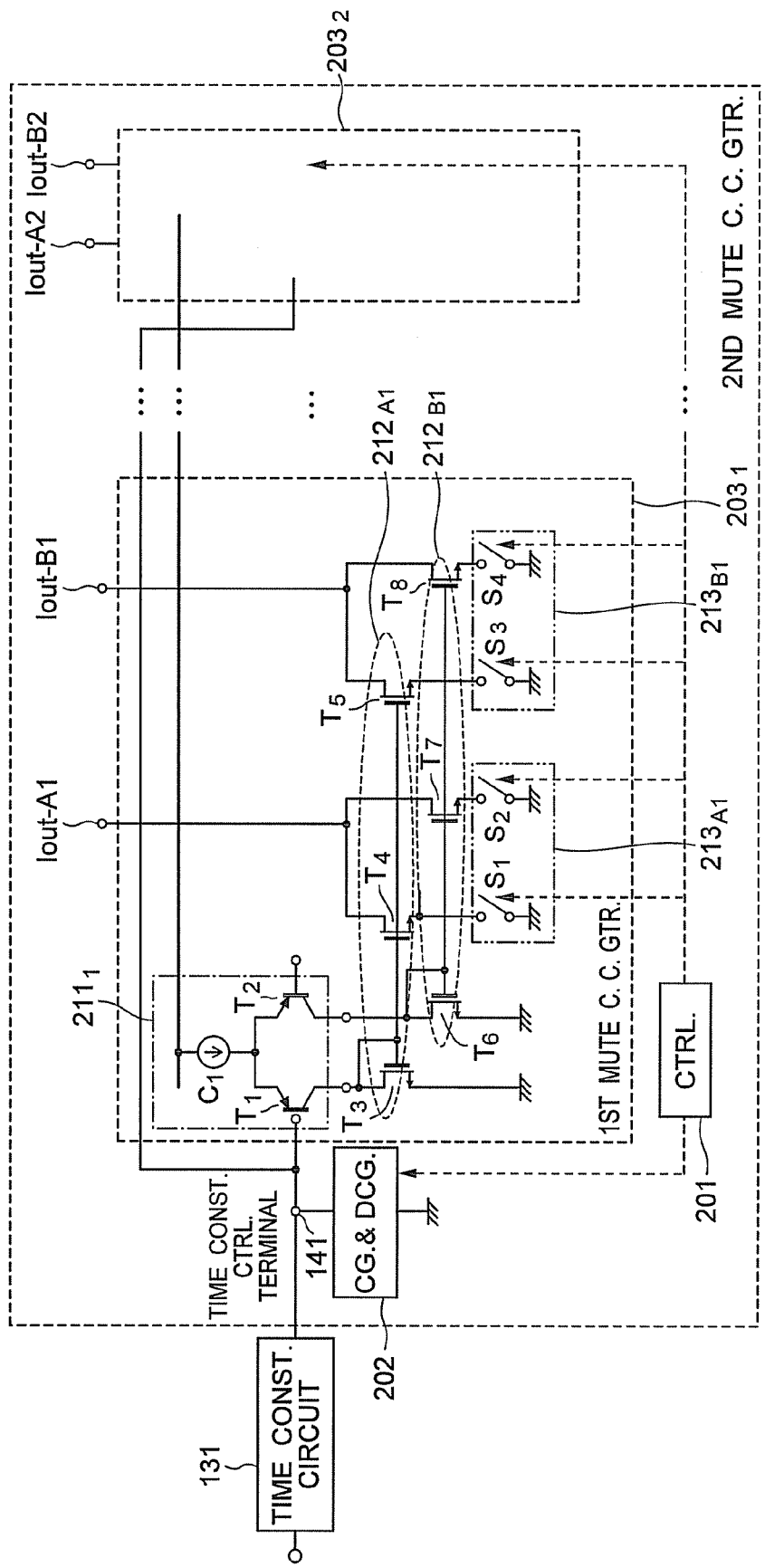
FIG. 9D shows another variation of the circuit configuration of FIG. 9A.

FIG. 9D shows another variation of the circuit configuration of FIG. 9A. In FIG. 9D, each of the first and second transistors $T_1$ and $T_2$ is a bipolar transistor, and each of the third to eighth transistors $T_3$ to $T_8$ is a field-effect transistor. In FIG. 9D, the first and second transistors $T_1$ and $T_2$ are PNP-type transistors, and the third to eighth transistors $T_3$ to $T_8$ are nMOS transistors. The connections of gates, sources, and drains of the third to eighth transistors $T_3$ to $T_8$ of FIG. 9D are the same as those of the third to eighth transistors $T_3$ to $T_8$ of FIG. 9A respectively.

Figure 9E:
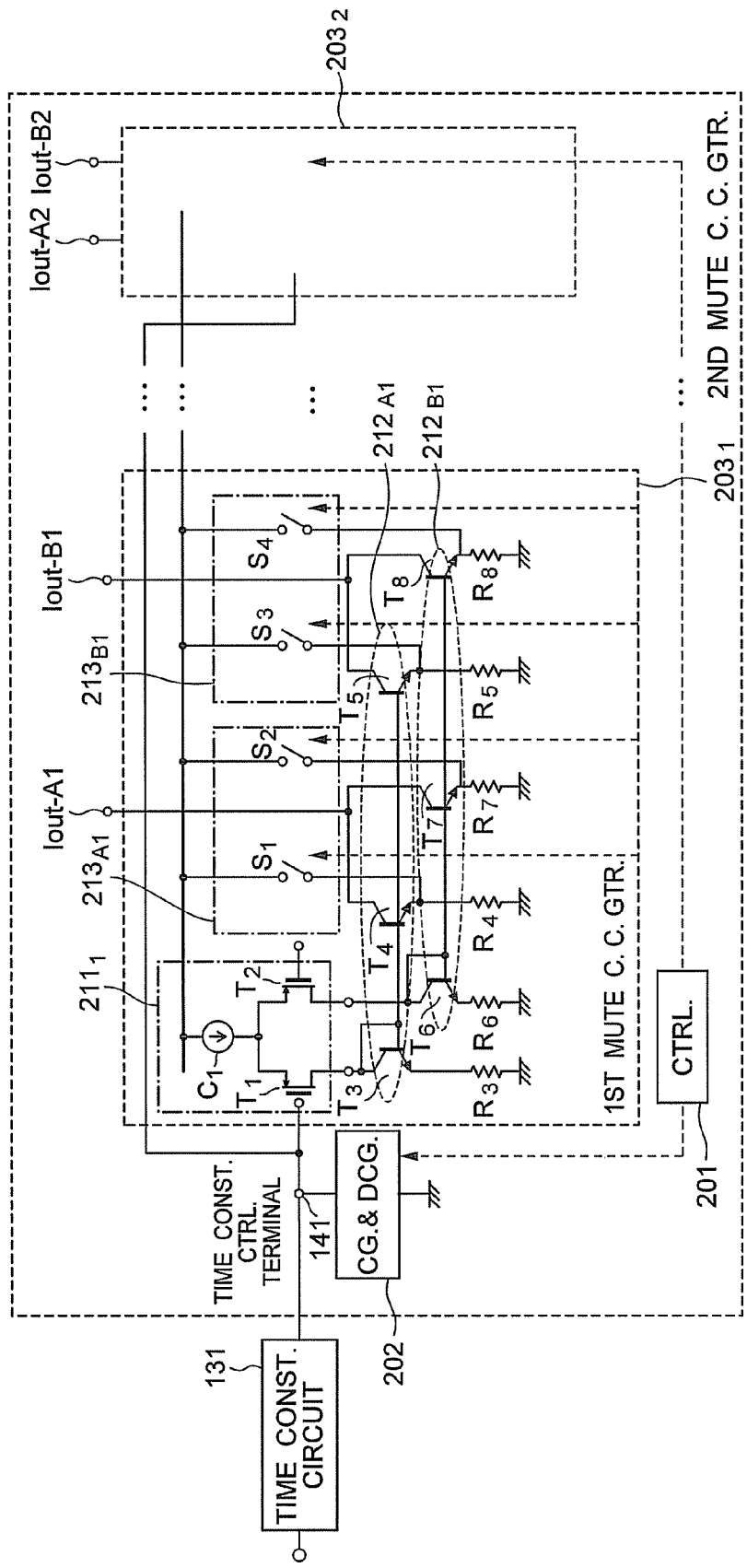
FIG. 9E shows another variation of the circuit configuration of FIG. 9A.

FIG. 9E shows another variation of the circuit configuration of FIG. 9A. In FIG. 9E, each of the first and second transistors $T_1$ and $T_2$ is a field-effect transistor, and each of the third to eighth transistors $T_3$ to $T_8$ is a bipolar transistor. In FIG. 9E, the first and second transistors $T_1$ and $T_2$ are pMOS transistors, and the third to eighth transistors $T_3$ to $T_8$ are NPN-type transistors. The connections of gates, sources, and drains of the first and second transistors $T_1$ and $T_2$ of FIG. 9E are the same as those of the first and second transistors $T_1$ and $T_2$ of FIG. 9A respectively.

As described above, each of the first to eighth transistors $T_1$ to $T_8$ is a bipolar transistor and a field-effect transistor. Combination of these transistors is not limited to the combinations of FIG. 9A, FIG. 9C, FIG. 9D, and FIG. 9E.

The above description can also be applied to the second control current generating circuit $203_2$. The second control current generating circuit $203_2$ includes the second current source $C_2$, the ninth to sixteenth transistors $T_9$ to $T_{16}$, the ninth to sixteenth resistor elements $R_9$ to $R_{16}$, and the fifth to eighth switches $S_5$ to $S_8$. These circuit elements correspond to the first current source $C_1$, the first to eighth transistors $T_1$ to $T_8$, the first to eighth resistor elements $R_1$ to $R_8$, and the first to fourth switches $S_1$ to $S_4$ respectively.

The above description can also be applied to the N-th control current generating circuit $203_N$. The N-th control current generating circuit $203_N$ includes the N-th current source $C_N$, the (8N−7)-th to (8N)-th transistors $T_{8N-7}$ to $T_{8N}$, the (8N−7)-th to (8N)-th resistor elements $R_{8N-7}$ to $R_{8N}$, and the (4N−3)-th to (4N)-th switches $S_{4N-3}$ to $S_{4N}$. These circuit elements correspond to the first current source $C_1$, the first to eighth transistors $T_1$ to $T_8$, the first to eighth resistor elements $R_1$ to $R_8$, and the first to fourth switches $S_1$ to $S_4$ respectively.

As described above, embodiments of the present invention can provide a preferred integrated circuit device for muting an audio signal.

The invention claimed is:

1. An n-channel integrated circuit device (n is an integer of 1 or greater) for muting an audio signal, the device comprising:
a control circuit configured to generate a control signal for controlling to switch between a sound output state and a mute state, and a delayed control signal obtained by delaying the control signal;
a charging and discharging circuit configured to charge or discharge a time constant control terminal according to the control signal, to change a voltage on the time constant control terminal from a first reference voltage to a second reference voltage, and to discharge or charge the time constant control terminal according to the delayed control signal, to change the voltage on the time constant control terminal from the second reference voltage to the first reference voltage;
an N-th voltage-to-current converting circuit (N is an integer from 1 to n) configured to compare the voltage on the time constant control terminal with an intermediate voltage which is between the first reference voltage and the second reference voltage, and generate a (2N−1)-th current corresponding to the voltage on the time constant control terminal and a (2N)-th current corresponding to the intermediate voltage, the N-th voltage-to-current converting circuit being configured to switch between a value of the (2N−1)-th current and a value of the (2N)-th current within a period for charging or discharging the time constant control terminal;
a (2N−1)-th mirror circuit configured to copy the (2N−1)-th current to generate (4N−3)-th and (4N−2)-th intermediate currents;
a (2N)-th mirror circuit configured to copy the (2N)-th current to generate (4N−1)-th and (4N)-th intermediate currents;
a (2N−1)-th selecting and combining circuit configured to cut off or select the (4N−3)-th intermediate current and cut off or select the (4N−1)-th intermediate current, according to the control signal and the delayed control signal, to combine a (2N−1)-th mute control current; and
a (2N)-th selecting and combining circuit configured to cut off or select the (4N−2)-th intermediate current and cut off or select the (4N)-th intermediate current, according to the control signal and the delayed control signal, to combine a (2N)-th mute control current.

2. The device according to claim 1, wherein,
after starting discharging or charging the time constant control terminal, the N-th voltage-to-current converting circuit returns back the values of the (2N−1)-th current and the (2N)-th current to values before starting charging or discharging the time constant control terminal.

3. The device according to claim 1, wherein,
the (2N−1)-th mute control current and the (2N)-th mute control current have the same amplitude and different polarities.

4. The device according to claim 1, wherein,
the N-th voltage-to-current converting circuit includes:
a (8N−7)-th transistor connected to the time constant control terminal and a current source, and configured to output the (2N−1)-th current; and
a (8N−6)-th transistor connected to a terminal of the intermediate voltage and the current source, and configured to output the (2N)-th current,
the (2N−1)-th mirror circuit includes:
a (8N−5)-th transistor connected to the (8N−7)-th transistor;
a (8N−4)-th transistor configured to output the (4N−3)-th intermediate current; and
a (8N−3)-th transistor configured to output the (4N−2)-th intermediate current,
the (2N)-th mirror circuit includes:
a (8N−2)-th transistor connected to the (8N−6)-th transistor;
a (8N−1)-th transistor configured to output the (4N−1)-th intermediate current; and
a (8N)-th transistor configured to output the (4N)-th intermediate current, and
each of the (8N−7)-th to the (8N)-th transistors is a bipolar transistor or a field-effect transistor.

5. The device according to claim 4, wherein,
the (8N−7)-th transistor is a bipolar transistor including:
a base connected to the time constant control terminal;
an emitter connected to the current source; and
a collector connected to the (8N−5)-th transistor, and the (8N−6)-th transistor is a bipolar transistor including:
a base connected to the terminal of the intermediate voltage;
an emitter connected to the current source; and
a collector connected to the (8N−2)-th transistor.

6. The device according to claim 4, wherein,
the (8N−7)-th transistor is a field-effect transistor including:
a gate connected to the time constant control terminal;
a source connected to the current source; and
a drain connected to the (8N−5)-th transistor, and
the (8N−6)-th transistor is a field-effect transistor including:
a gate connected to the terminal of the intermediate voltage;
a source connected to the current source; and
a drain connected to the (8N−2)-th transistor.

7. The device according to claim 1, wherein,
the (2N−1)-th selecting and combining circuit
cuts off the (4N−3)-th and (4N−1)-th intermediate currents, when the control signal and the delayed control signal are first logical levels;
selects and cuts off the (4N−3)-th and (4N−1)-th intermediate currents respectively, when the control signal and the delayed control signal are a second and the first logical levels respectively;
selects the (4N−3)-th and (4N−1)-th intermediate currents, when the control signal and the delayed control signal are the second logical levels; and
cuts off and selects the (4N−3)-th and (4N−1)-th intermediate currents respectively, when the control signal and the delayed control signal are the first and the second logical levels respectively,
to combine the (2N−1)-th mute control current, and
the (2N)-th selecting and combining circuit
selects the (4N−2)-th and (4N)-th intermediate currents, when the control signal and the delayed control signal are the first logical levels;
cuts off and selects the (4N−2)-th and (4N)-th intermediate currents respectively, when the control signal and the delayed control signal are the second and the first logical levels respectively;
cuts off the (4N−2)-th and (4N)-th intermediate currents, when the control signal and the delayed control signal are the second logical levels; and
selects and cuts off the (4N−2)-th and (4N)-th intermediate currents respectively, when the control signal and the delayed control signal are the first and the second logical levels respectively,
to combine the (2N)-th mute control current.

8. The device according to claim 7, wherein,
the control circuit
sets the control signal and the delayed control signal to the first logical levels, in the mute state;
sets the control signal and the delayed control signal to the second and first logical levels respectively, when the mute state is switched to the sound output state;
sets the control signal and the delayed control signal to the second logical levels, in the sound output state; and
sets the control signal and the delayed control signal to the first and second logical levels respectively, when the sound output state is switched to the mute state.

9. The device according to claim 8, wherein,
the control circuit
switches the delayed control signal from the first logical level to the second logical level, triggered by a fact that the voltage on the time constant control terminal reaches the second reference voltage, while the mute state is switched to the sound output state; and
switches the delayed control signal from the second logical level to the first logical level, triggered by a fact that the voltage on the time constant control terminal reaches the second reference voltage, while the sound output state is switched to the mute state.

10. An integrated circuit device for muting an audio signal, the device comprising:
a control circuit configured to generate a control signal for controlling to switch between a sound output state and a mute state, and a delayed control signal obtained by delaying the control signal;
a charging and discharging circuit configured to charge or discharge a time constant control terminal according to the control signal, to change a voltage on the time constant control terminal from a first reference voltage to a second reference voltage, and to discharge or charge the time constant control terminal according to the delayed control signal, to change the voltage on the time constant control terminal from the second reference voltage to the first reference voltage;
an voltage-to-current converting circuit configured to compare the voltage on the time constant control terminal with an intermediate voltage which is between the first reference voltage and the second reference voltage, and generate a first current corresponding to the voltage on the time constant control terminal and a second current corresponding to the intermediate voltage, the voltage-to-current converting circuit being configured to switch between a value of the first current and a value of the second current within a period for charging or discharging the time constant control terminal;
a first mirror circuit configured to copy the first current to generate first and second intermediate currents;
a second mirror circuit configured to copy the second current to generate third and fourth intermediate currents;
a first selecting and combining circuit configured to cut off or select the first intermediate current and cut off or select the third intermediate current, according to the control signal and the delayed control signal, to combine a first mute control current; and
a second selecting and combining circuit configured to cut off or select the second intermediate current and cut off or select the fourth intermediate current, according to the control signal and the delayed control signal, to combine a second mute control current.

11. The device according to claim 10, wherein,
after starting discharging or charging the time constant control terminal, the first voltage-to-current converting circuit returns back the values of the first current and the second current to values before starting charging or discharging the time constant control terminal.

12. The device according to claim 10, wherein,
the first mute control current and the second mute control current have the same amplitude and different polarities.

13. The device according to claim 10, wherein,
the voltage-to-current converting circuit includes:
a first transistor connected to the time constant control terminal and a current source, and configured to output the first current; and
a second transistor connected to a terminal of the intermediate voltage and the current source, and configured to output the second current,
the first mirror circuit includes:
a third transistor connected to the first transistor;

a fourth transistor configured to output the first intermediate current; and
a fifth transistor configured to output the second intermediate current,
the second mirror circuit includes:
a sixth transistor connected to the second transistor;
a seventh transistor configured to output the third intermediate current; and
a eighth transistor configured to output the fourth intermediate current, and
each of the first to the eighth transistors is a bipolar transistor, or a field-effect transistor.

14. The device according to claim 13, wherein,
the first transistor is a bipolar transistor including:
a base connected to the time constant control terminal;
an emitter connected to the current source; and
a collector connected to the third transistor, and
the second transistor is a bipolar transistor including:
a base connected to the terminal of the intermediate voltage;
an emitter connected to the current source; and
a collector connected to the sixth transistor.

15. The device according to claim 13, wherein,
the first transistor is a field-effect transistor including:
a gate connected to the time constant control terminal;
a source connected to the current source; and
a drain connected to the third transistor, and
the second transistor is a field-effect transistor including:
a gate connected to the terminal of the intermediate voltage;
a source connected to the current source; and
a drain connected to the sixth transistor.

16. The device according to claim 10, wherein,
the first selecting and combining circuit
cuts off the first and third intermediate currents, when the control signal and the delayed control signal are first logical levels;
selects and cuts off the first and third intermediate currents respectively, when the control signal and the delayed control signal are a second and the first logical levels respectively;
selects the first and third intermediate currents, when the control signal and the delayed control signal are the second logical levels; and
cuts off and selects the first and third intermediate currents respectively, when the control signal and the delayed control signal are the first and the second logical levels respectively,
to combine the first mute control current, and
the second selecting and combining circuit
selects the second and fourth intermediate currents, when the control signal and the delayed control signal are the first logical levels;
cuts off and selects the second and fourth intermediate currents respectively, when the control signal and the delayed control signal are the second and the first logical levels respectively;
cuts off the second and fourth intermediate currents, when the control signal and the delayed control signal are the second logical levels; and
selects and cuts off the second and fourth intermediate currents respectively, when the control signal and the delayed control signal are the first and the second logical levels respectively,
to combine the second mute control current.

17. The device according to claim 16, wherein,
the control circuit
sets the control signal and the delayed control signal to the first logical levels, in the mute state;
sets the control signal and the delayed control signal to the second and first logical levels respectively, when the mute state is switched to the sound output state;
sets the control signal and the delayed control signal to the second logical levels, in the sound output state; and
sets the control signal and the delayed control signal to the first and second logical levels respectively, while the sound output state is switched to the mute state.

18. The device according to claim 17, wherein,
the control circuit
switches the delayed control signal from the first logical level to the second logical level, triggered by a fact that the voltage on the time constant control terminal reaches the second reference voltage, while the mute state is switched to the sound output state; and
switches the delayed control signal from the second logical level to the first logical level, triggered by a fact that the voltage on the time constant control terminal reaches the second reference voltage, while the sound output state is switched to the mute state.

19. An audio system comprising:
an n-channel integrated circuit device (n is an integer of 1 or greater) for muting an audio signal, the device including:
a control circuit configured to generate a control signal for controlling to switch between a sound output state and a mute state, and a delayed control signal obtained by delaying the control signal,
a charging and discharging circuit configured to charge or discharge a time constant control terminal according to the control signal, to change a voltage on the time constant control terminal from a first reference voltage to a second reference voltage, and to discharge or charge the time constant control terminal according to the delayed control signal, to change the voltage on the time constant control terminal from the second reference voltage to the first reference voltage,
an N-th voltage-to-current converting circuit (N is an integer from 1 to n) configured to compare the voltage on the time constant control terminal with an intermediate voltage which is between the first reference voltage and the second reference voltage, and generate a (2N−1)-th current corresponding to the voltage on the time constant control terminal and a (2N)-th current corresponding to the intermediate voltage, the N-th voltage-to-current converting circuit being configured to switch between a value of the (2N−1)-th current and a value of the (2N)-th current within a period for charging or discharging the time constant control terminal,
a (2N−1)-th mirror circuit configured to copy the (2N−1)-th current to generate (4N−3)-th and (4N−2)-th intermediate currents,
a (2N)-th mirror circuit configured to copy the (2N)-th current to generate (4N−1)-th and (4N)-th intermediate currents,
a (2N−1)-th selecting and combining circuit configured to cut off or select the (4N−3)-th intermediate current and cut off or select the (4N−1)-th intermediate current, according to the control signal and the delayed control signal, to combine a (2N−1)-th mute control current, and
a (2N)-th selecting and combining circuit configured to cut off or select the (4N−2)-th intermediate current and cut off or select the (4N)-th intermediate current, according to the control signal and the delayed control signal, to combine a (2N)-th mute control current;

an N-th sound output amplifier configured to be controlled by the (2N−1)-th mute control current;

an N-th mute amplifier configured to be controlled by the (2N)-th mute control current; and an N-th speaker connected to the N-th sound output amplifier and the N-th mute amplifier.

20. The system according to claim 19, wherein, a first input terminal of the N-th sound output amplifier is connected to an audio signal line, a first input terminal of the N-th mute amplifier is connected to the ground, output terminals of the N-th sound output amplifier and the N-th mute amplifier are connected to the N-th speaker, and second input terminals of the N-th sound output amplifier and the N-th mute amplifier are connected to the output terminals of the N-th sound output amplifier and the N-th mute amplifier through an N-th feedback circuit.

* * * * *